(12) United States Patent
Yoneda et al.

(10) Patent No.: US 11,552,206 B2
(45) Date of Patent: Jan. 10, 2023

(54) OPTICAL WAVEGUIDE TYPE PHOTODETECTOR

(71) Applicant: SUMITOMO ELECTRIC DEVICE INNOVATIONS, INC., Kanagawa (JP)

(72) Inventors: Yoshihiro Yoneda, Yokohama (JP); Takuya Okimoto, Yokohama (JP)

(73) Assignee: SUMITOMO ELECTRIC DEVICE INNOVATIONS, INC., Kanagawa (JP)

(*) Notice: Subject to any disclaimer, the term of this patent is extended or adjusted under 35 U.S.C. 154(b) by 46 days.

(21) Appl. No.: 17/188,393

(22) Filed: Mar. 1, 2021

(65) Prior Publication Data
US 2021/0273122 A1 Sep. 2, 2021

(30) Foreign Application Priority Data

Mar. 2, 2020 (JP) .............................. JP2020-035029

(51) Int. Cl.
H01L 31/102 (2006.01)
H01L 31/0232 (2014.01)
H01L 31/109 (2006.01)
H01L 31/0304 (2006.01)

(52) U.S. Cl.
CPC .. *H01L 31/02327* (2013.01); *H01L 31/03046* (2013.01); *H01L 31/109* (2013.01)

(58) Field of Classification Search
CPC ..... H01L 31/02327; H01L 31/145–153; H01L 31/03046; H01L 31/109
See application file for complete search history.

(56) References Cited

U.S. PATENT DOCUMENTS

| 10,910,503 | B1* | 2/2021 | Bian ........................ G02B 6/13 |
| 2004/0089876 | A1 | 5/2004 | Kuwatsuka |
| 2007/0051939 | A1 | 3/2007 | Nakahara |
| 2020/0185561 | A1* | 6/2020 | Huang ................ H01L 31/0312 |

FOREIGN PATENT DOCUMENTS

JP 2013-110207 6/2013

OTHER PUBLICATIONS

Office Action dated Apr. 26, 2022 for U.S. Appl. No. 17/188,335.

* cited by examiner

*Primary Examiner* — Suberr L Chi
(74) *Attorney, Agent, or Firm* — Smith, Gambrell & Russell, LLP.

(57) ABSTRACT

An optical waveguide type photodetector includes a first semiconductor layer of a first conductive type, a multiplication layer of a first conductive type on the first semiconductor layer, an optical waveguide structure, and a photodiode structure. The photodiode structure has a third semiconductor layer of a second conductive type, an optical absorption layer of an intrinsic conductive type or of a second conductive type, and a second semiconductor layer of a second conductive type. The optical waveguide structure includes an optical waveguiding core layer and a cladding layer. An end face of the photodiode structure located in a second region of the first semiconductor layer and an end face of the optical waveguide structure located in a first region of the first semiconductor layer are in contact.

16 Claims, 14 Drawing Sheets

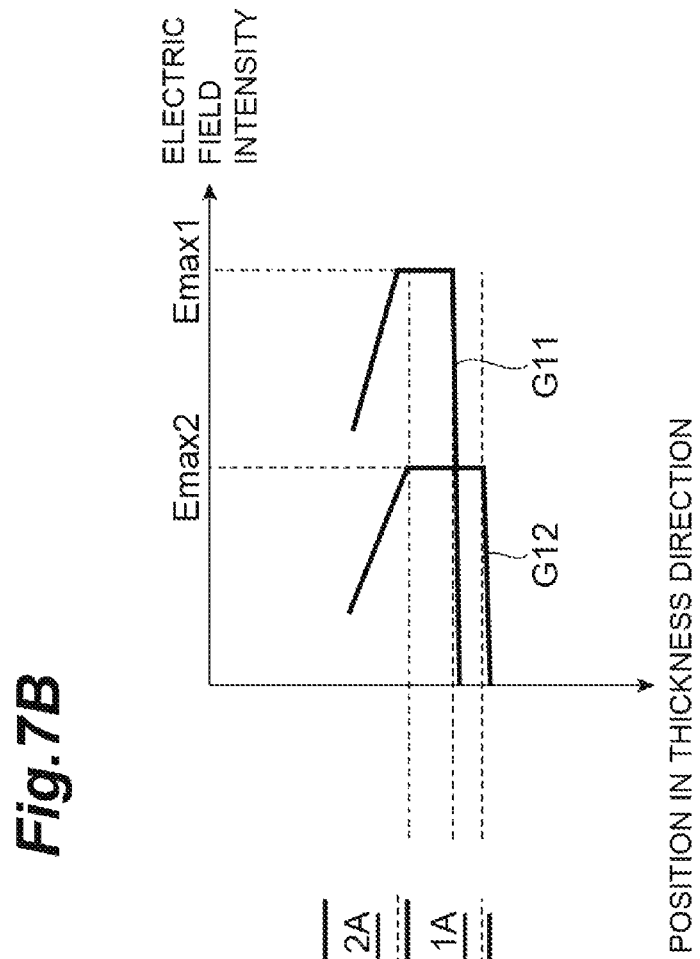

OPTICAL WAVEGUIDE TYPE PHOTODETECTOR

CROSS-REFERENCE TO RELATED APPLICATIONS

This application is based upon and claims the benefit of the priority from Japanese Patent Application No. 2020-035029, filed on Mar. 2, 2020, the entire contents of which are incorporated herein by reference.

TECHNICAL FIELD

The present disclosure relates to an optical waveguide type photodetector.

BACKGROUND

JP2013-110207A discloses a technology related to a semiconductor optical integrated element and a method of manufacturing the same. The semiconductor optical integrated element disclosed in this literature includes a photodiode region formed on a semiconductor substrate, and an optical waveguide region subjected to butt joint coupling to an end face of the photodiode region. The photodiode region includes an optical absorption layer and a p-type cladding layer laminated in this order on an n-type cladding layer. The optical waveguide region includes an optical waveguide layer and an upper cladding layer laminated in this order on the n-type cladding layer. The optical waveguide layer has an ascending portion with respect to the inclined butt joint end face.

SUMMARY

The present disclosure provides an optical waveguide type photodetector. The optical waveguide type photodetector includes a first semiconductor layer, a multiplication layer, an optical waveguide structure, and a waveguide type photodiode structure. The first semiconductor layer is of a first conductive type. The multiplication layer is of a first conductive type. The multiplication layer is provided on the first semiconductor layer. The optical waveguide structure has an end face. The optical waveguide structure is provided on a first region of the multiplication layer and includes an optical waveguiding core layer and a cladding layer. The waveguide type photodiode structure has an end face. The waveguide type photodiode structure is provided on a second region of the multiplication layer. The waveguide type photodiode structure has a third semiconductor layer being of a second conductive type, an optical absorption layer being of an intrinsic conductive type or of a second conductive type, a second semiconductor layer being of a second conductive type which are arranged in this order. The end face of the waveguide type photodiode structure and the end face of the optical waveguide structure are in contact.

The present disclosure provides an optical waveguide type photodetector. The optical waveguide type photodetector includes a first semiconductor layer, an optical waveguide structure, and a waveguide type photodiode structure. The first semiconductor layer is of a first conductive type. The optical waveguide structure has an end face. The optical waveguide structure is provided on a first region of the first semiconductor layer and includes an optical waveguiding core layer and a cladding layer. The waveguide type photodiode structure has an end face. The waveguide type photodiode structure is provided on a second region of the first semiconductor layer. The waveguide type photodiode structure has a multiplication layer being of a first conductive type, a seventh semiconductor layer being of a second conductive type, an optical absorption layer being of an intrinsic conductive type or a second conductive type, and a second semiconductor layer being of a second conductive type which are arranged in this order. The end face of the waveguide type photodiode structure faces to the end face of the optical waveguide structure. The sixth semiconductor layer is of a second conductive type. The sixth semiconductor layer is located between the end face of the optical waveguide structure and the end face of the waveguide type photodiode structure. The sixth semiconductor layer is contacted with the multiplication layer in the end face of the waveguide type photodiode structure.

BRIEF DESCRIPTION OF THE DRAWINGS

FIG. 7A is an enlarged view of a part in the vicinity of an end face of the multiplication layer in the comparative example.

FIG. 7B is a view illustrating change in electric field intensity of the multiplication layer in a thickness direction.

DETAILED DESCRIPTION

Figure 1:
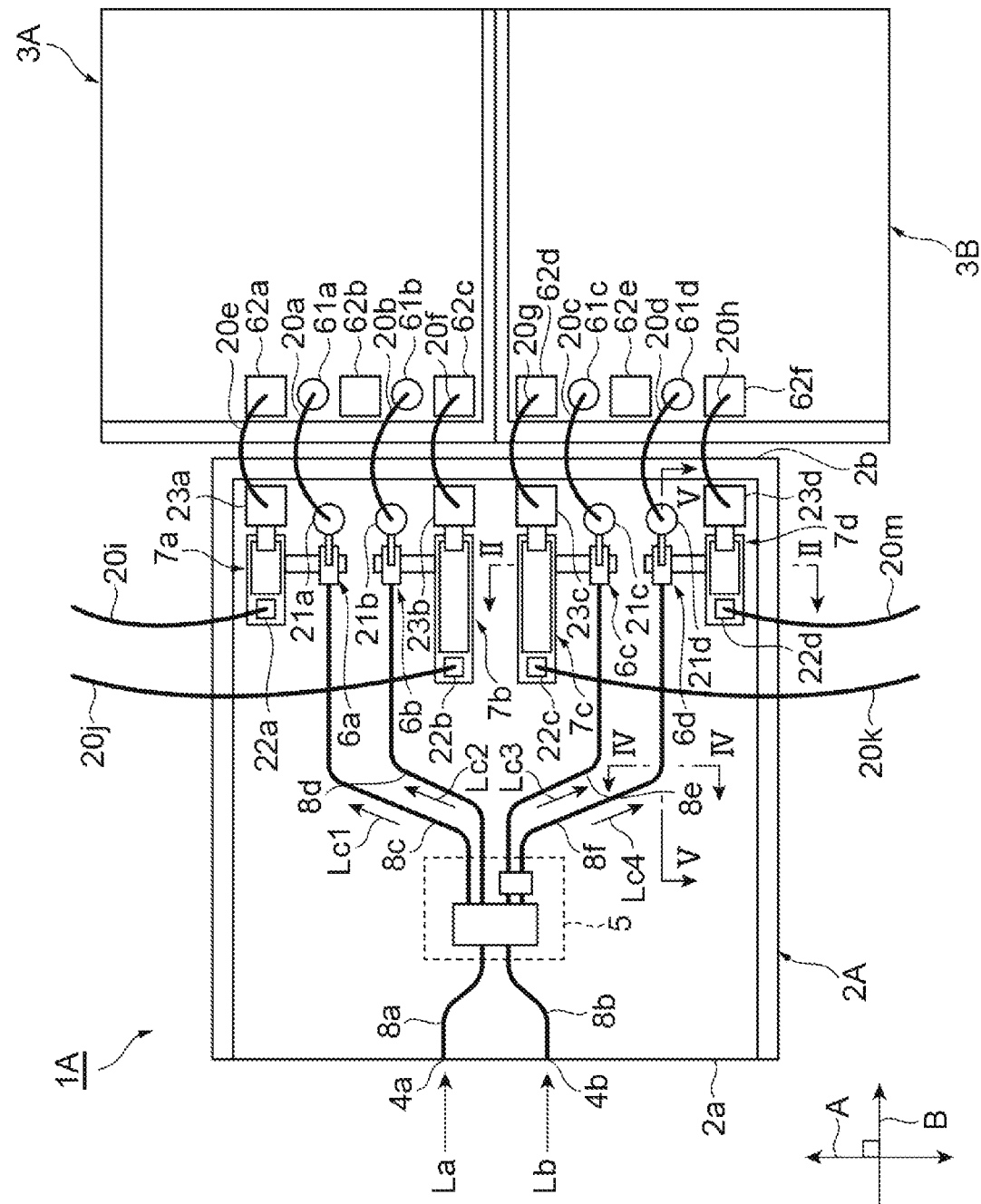
FIG. 1 is a plan view illustrating a configuration of a light receiving device including an optical waveguide type photodetector according to a first embodiment.

Problem to be Solved by Present Disclosure

In recent years, optical waveguide type photodetectors in which an optical waveguide structure and a waveguide type photodiode structure are integrated on a common substrate have been researched and developed. For example, such optical waveguide type photodetectors are used as reception front ends of an optical transmission system which has a high transmission rate such as 40 Gb/s or faster and in which a multi-level modulation method and a digital coherent reception method are combined. An optical waveguide type photodetector is produced by forming a butt joint structure constituted of a semiconductor lamination unit for a photodiode including an optical absorption layer and a semiconductor lamination unit for an optical waveguide including an optical waveguiding core layer on a substrate.

An optical waveguide type photodetector used as a reception front end of an optical transmission system may be required to have high reception sensitivity. As a solution therefor, it is conceivable to cause a waveguide type photodiode structure to have an avalanche multiplication action. In such a case, it is preferable to provide a multiplication layer for avalanche multiplication between an optical absorption layer constituting a photodiode and a semiconductor layer thereunder. However, in many cases, a butt joint interface is formed through wet etching, and thus it is inclined with respect to a direction perpendicular to a main surface of a substrate (for example, refer to JP2013-110207A). Therefore, an end face (butt joint interface) of a multiplication layer is also inclined with respect to the direction. In such a case, depletion does not proceed in parts in the vicinity of the end faces of the multiplication layer compared to other parts in the multiplication layer, and thus a depletion range of a part in the vicinity of the end face of the multiplication layer become narrow compared to depletion ranges of other parts in the multiplication layer. Hence, a maximum electric field (Emax) becomes larger in a part in the vicinity of the end face of the multiplication layer than in other parts in the multiplication layer. As a result, edge breakdown is likely to occur.

Effects of Present Disclosure

According to an optical waveguide type photodetector of the present disclosure, a depletion range of a multiplication layer for avalanche multiplication can be made approximately uniform.

DESCRIPTION OF EMBODIMENT OF PRESENT DISCLOSURE

First, embodiments of the present disclosure will be enumerated and described. According to an embodiment, there is provided an optical waveguide type photodetector including a first semiconductor layer, a multiplication layer, an optical waveguide structure, and a waveguide type photodiode structure. The first semiconductor layer is of a first conductive type. The multiplication layer is of a first conductive type. The multiplication layer is provided on the first semiconductor layer. The optical waveguide structure has an end face. The optical waveguide structure is provided on a first region of the multiplication layer and includes an optical waveguiding core layer and a cladding layer. The waveguide type photodiode structure has an end face. The waveguide type photodiode structure is provided on a second region of the multiplication layer. The waveguide type photodiode structure has a third semiconductor layer being of a second conductive type, an optical absorption layer being of an intrinsic conductive type or of a second conductive type, a second semiconductor layer being of a second conductive type which are arranged in this order. The end face of the waveguide type photodiode structure and the end face of the optical waveguide structure are in contact.

The optical waveguide type photodetector includes the multiplication layer and the third semiconductor layer. The multiplication layer is a carrier multiplication layer provided between the first semiconductor layer and the optical absorption layer. The multiplication layer is of a first conductive type or is an undoped layer. The third semiconductor layer is an electric field lowering layer provided between the multiplication layer and the optical absorption layer. The third semiconductor layer is of a second conductive type. In this manner, since the optical waveguide type photodetector includes the multiplication layer and the third semiconductor layer, a waveguide type photodiode structure having an avalanche multiplication action can be obtained. As described above, when an end face of the multiplication layer is inclined, depletion does not proceed in a part in the vicinity of the end face of the multiplication layer compared to other parts in the multiplication layer, and thus a depletion range of a part in the vicinity of the end face of the multiplication layer become narrow compared to other parts in the multiplication layer. In contrast, in this optical waveguide type photodetector, the multiplication layer and the third semiconductor layer extend between the first region of the first semiconductor layer and the optical waveguiding core layer. Hence, unevenness of the depletion range caused by inclination of the end face is reduced. That is, according to this optical waveguide type photodetector, the depletion range of the multiplication layer can be made approximately uniform from a central part to a part in the vicinity of the end face. As a result, partial increase in maximum electric field (Emax) in the multiplication layer is curbed, and edge breakdown can be made unlikely to occur.

In the foregoing optical waveguide type photodetector, the multiplication layer between the first region of the first semiconductor layer and the optical waveguiding core layer may be provided throughout an entire area of the optical waveguide structure. In such a case, when an optical waveguide type photodetector is manufactured, it is only necessary to cause the multiplication layer and the third semiconductor layer to grow on the entire surface of the first semiconductor layer, and thus manufacturing steps can be simplified.

In the foregoing optical waveguide type photodetector may further include a buffer layer of a first conductive type or being an undoped layer, and a fourth semiconductor layer of a first conductive type. The buffer layer is provided between the first semiconductor layer and the multiplication layer and has a lower impurity concentration than the first semiconductor layer. The fourth semiconductor layer is provided between the buffer layer and the multiplication layer and has a higher impurity concentration than the multiplication layer. Due to the fourth semiconductor layer, the depletion range can expand by controlling the electric field intensity of the buffer layer at the time of applying a reverse bias voltage to the extent that multiplication of carriers does not occur. Hence, a CR time constant of the photodiode (C: capacitance, and R: resistance) can be further reduced. As a result, faster (broadband) high-frequency response characteristics can be realized.

In the foregoing optical waveguide type photodetector, the waveguide type photodiode structure may further include a fifth semiconductor layer provided between the third semiconductor layer and the optical absorption layer. A center position of the optical waveguiding core layer in a thickness direction and a center position of the optical absorption layer in the thickness direction can be accurately aligned with each other by adjusting the thickness of the fifth semiconductor layer. Hence, even when the optical absorption layer is thinned, a coupling loss between the optical absorption layer and the optical waveguiding core layer can be reduced by matching a mode field of the optical absorption layer and a mode field of the optical waveguiding core layer.

According to another embodiment, there is provided an optical waveguide type photodetector including a first semiconductor layer, an optical waveguide structure, and a waveguide type photodiode structure. The first semiconductor layer is of a first conductive type. The optical waveguide structure has an end face. The optical waveguide structure is provided on a first region of the first semiconductor layer and includes an optical waveguiding core layer and a cladding layer. The waveguide type photodiode structure has an end face. The waveguide type photodiode structure is provided on a second region of the first semiconductor layer. The waveguide type photodiode structure has a multiplication layer being of a first conductive type, a seventh semiconductor layer being of a second conductive type, an optical absorption layer being of an intrinsic conductive type or a second conductive type, and a second semiconductor layer being of a second conductive type which are arranged in this order. The end face of the waveguide type photodiode structure faces to the end face of the optical waveguide structure. The sixth semiconductor layer is of a second conductive type. The sixth semiconductor layer is located between the end face of the optical waveguide structure and the end face of the waveguide type photodiode structure. The sixth semiconductor layer is contacted with the multiplication layer in the end face of the waveguide type photodiode structure.

Also in this optical waveguide type photodetector, similar to the optical waveguide type photodetector described above, the optical waveguide type photodetector includes the multiplication layer and the third semiconductor layer. Accordingly, a waveguide type photodiode structure having an avalanche multiplication action can be obtained. Furthermore, in this optical waveguide type photodetector, the sixth semiconductor layer of a second conductive type is provided between the end face of the optical waveguide structure and the end face of the waveguide type photodiode structure. The sixth semiconductor layer comes into contact with the multiplication layer. In this case, at the time of applying a reverse bias, a part in the vicinity of the end face of the multiplication layer are supplemented with carriers from the sixth semiconductor layer, and thus the depletion range of a part in the vicinity of the end face of the multiplication layer expand. That is, according to this optical waveguide type photodetector, the depletion range of the multiplication layer can be made approximately uniform from a central part to a part in the vicinity of the end face. As a result, partial increase in maximum electric field (Emax) in the multiplication layer is curbed, and edge breakdown can be made unlikely to occur.

Details of Embodiment of Present Disclosure

Specific examples of an optical waveguide type photodetector according to embodiments of the present disclosure will be described below with reference to the drawings. The present invention is not limited to the examples, but is indicated by the appended claims and is intended to include all modifications within the meaning and scope equivalent to the appended claims. In the following description, the same elements will be designated by the same reference numerals in the description of the drawings, and redundant description will be omitted. In the following description, the term "undoped" denotes that the impurity concentration is an extremely low concentration such as $1 \times 10^{15}$ cm$^{-3}$ or lower, for example.

An embodiment of the present disclosure relates to an avalanche photodiode (APD) used in high-speed and large capacitance optical communication systems. The embodiment of the present disclosure relates to realization of rapidity, high sensitivity performance, and high reliability using a waveguide structure. The embodiment of the present disclosure relates to a multi-channel integrated photodetector in which a 90° hybrid function used in a digital coherent optical communication system is monolithically integrated. The embodiment of the present disclosure relates to realization of high sensitivity performance and high reliability using integration of an APD structure.

First Embodiment

Figure 2:
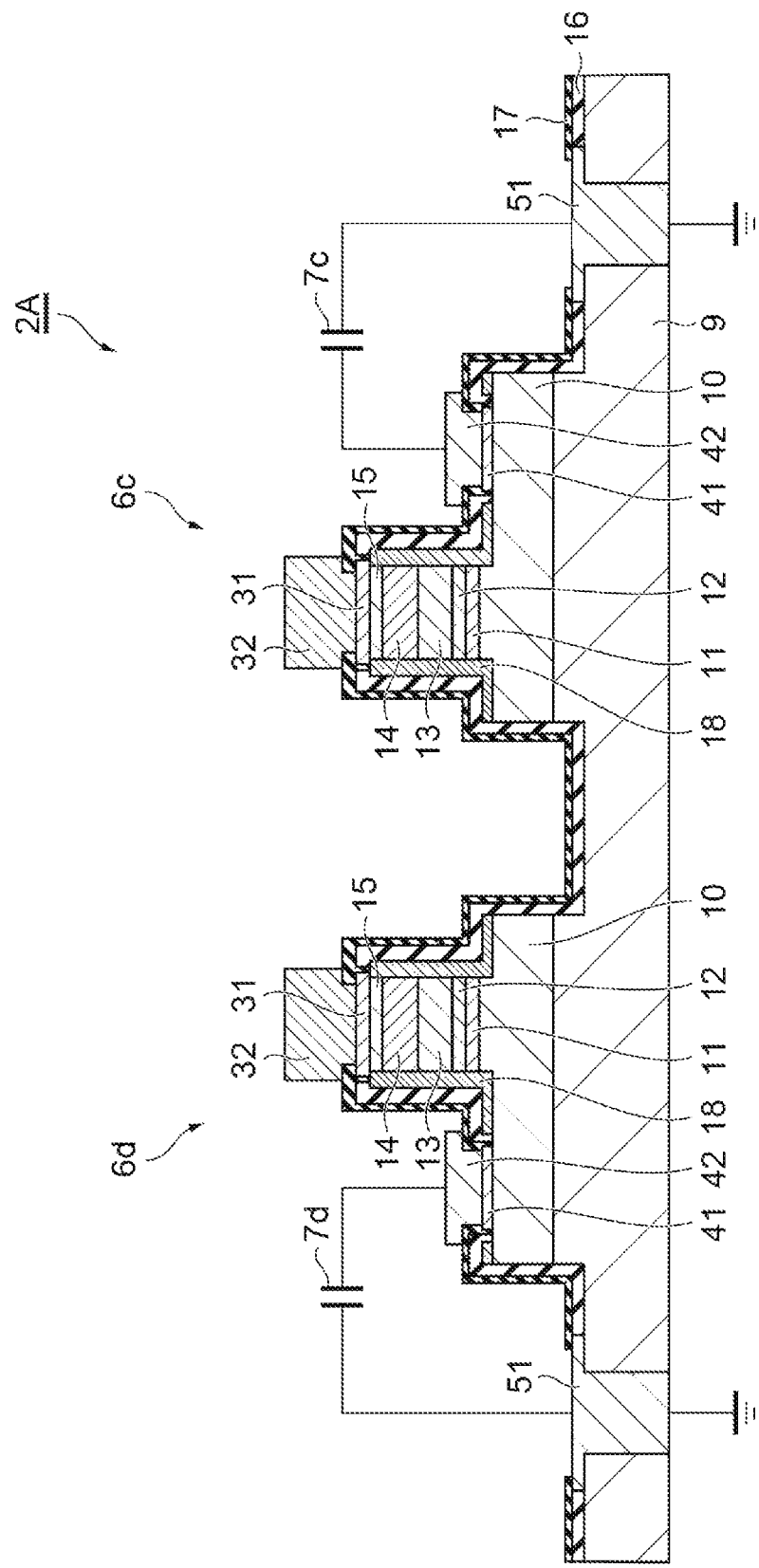
FIG. 2 is a view illustrating a cross section along line II-II illustrated in FIG. 1.
Figure 3:
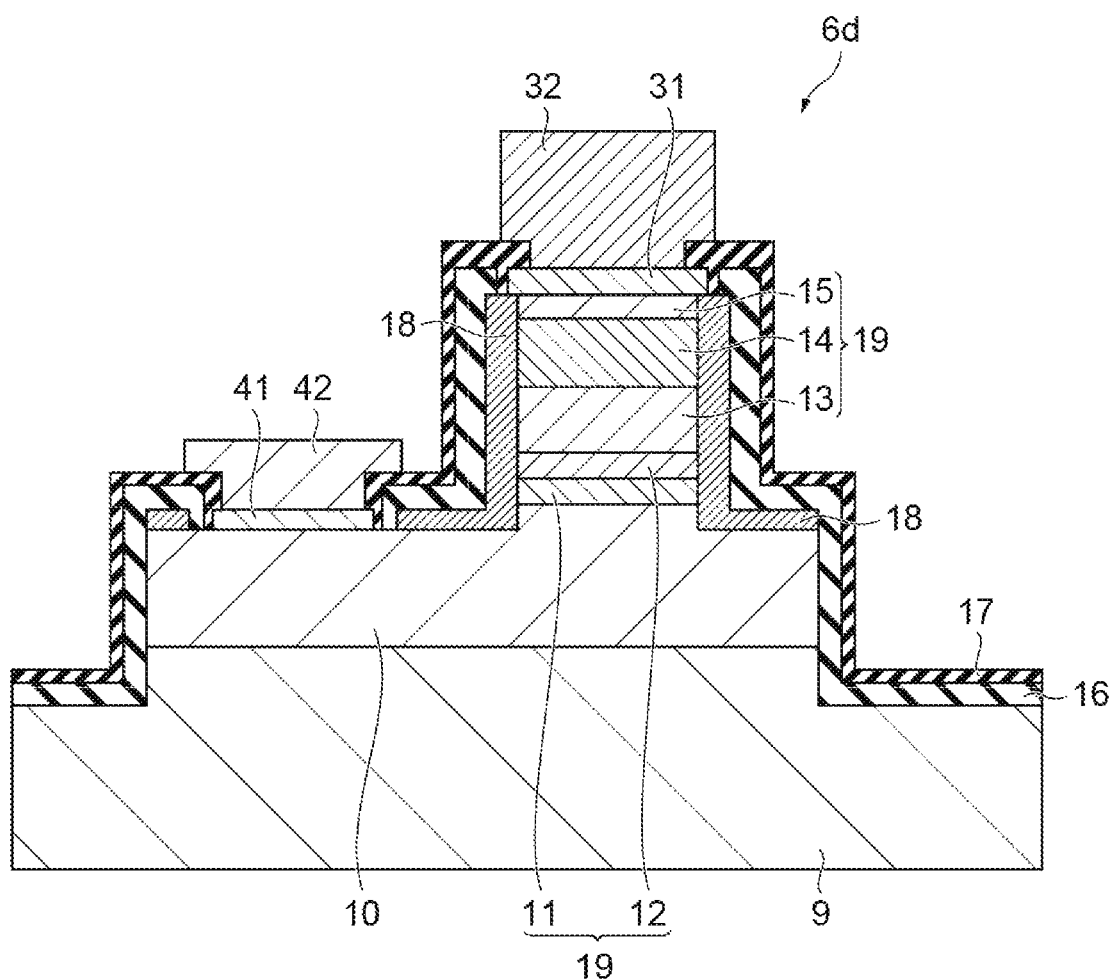
FIG. 3 is an enlarged cross-sectional view illustrating a part of FIG. 2.
Figure 4:
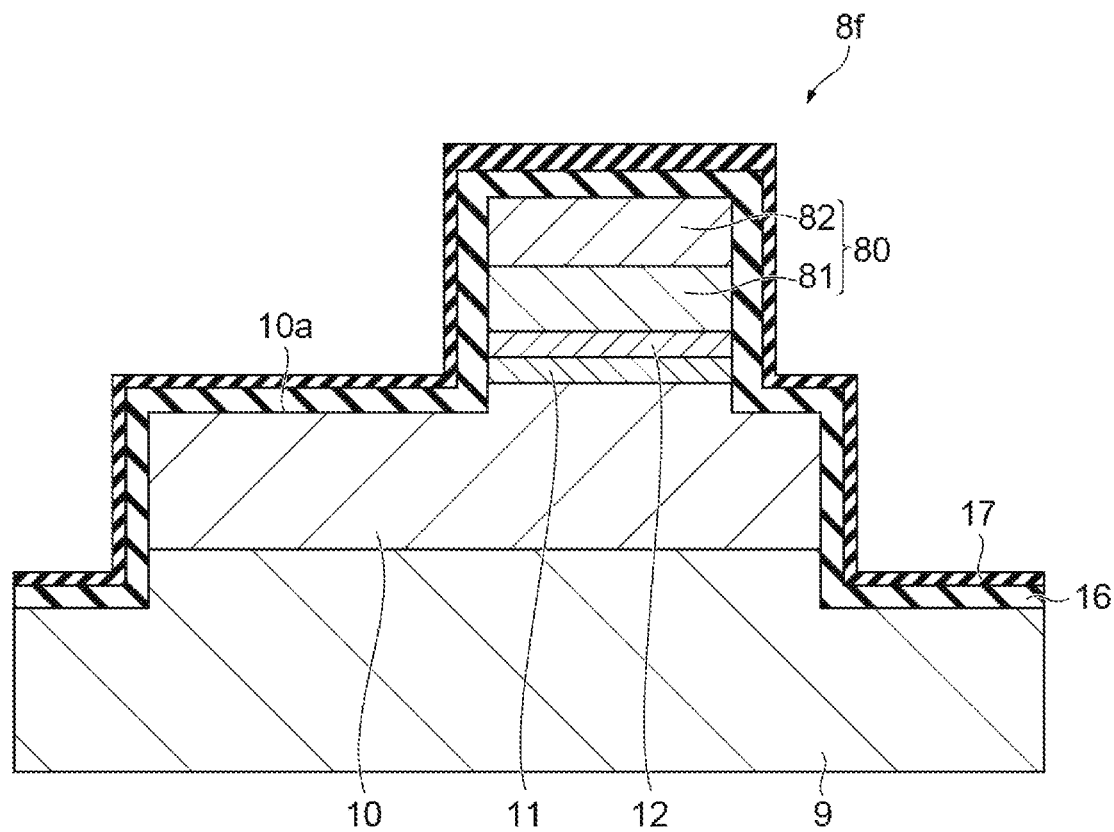
FIG. 4 is a view illustrating a cross section along line IV-IV illustrated in FIG. 1.
Figure 5:
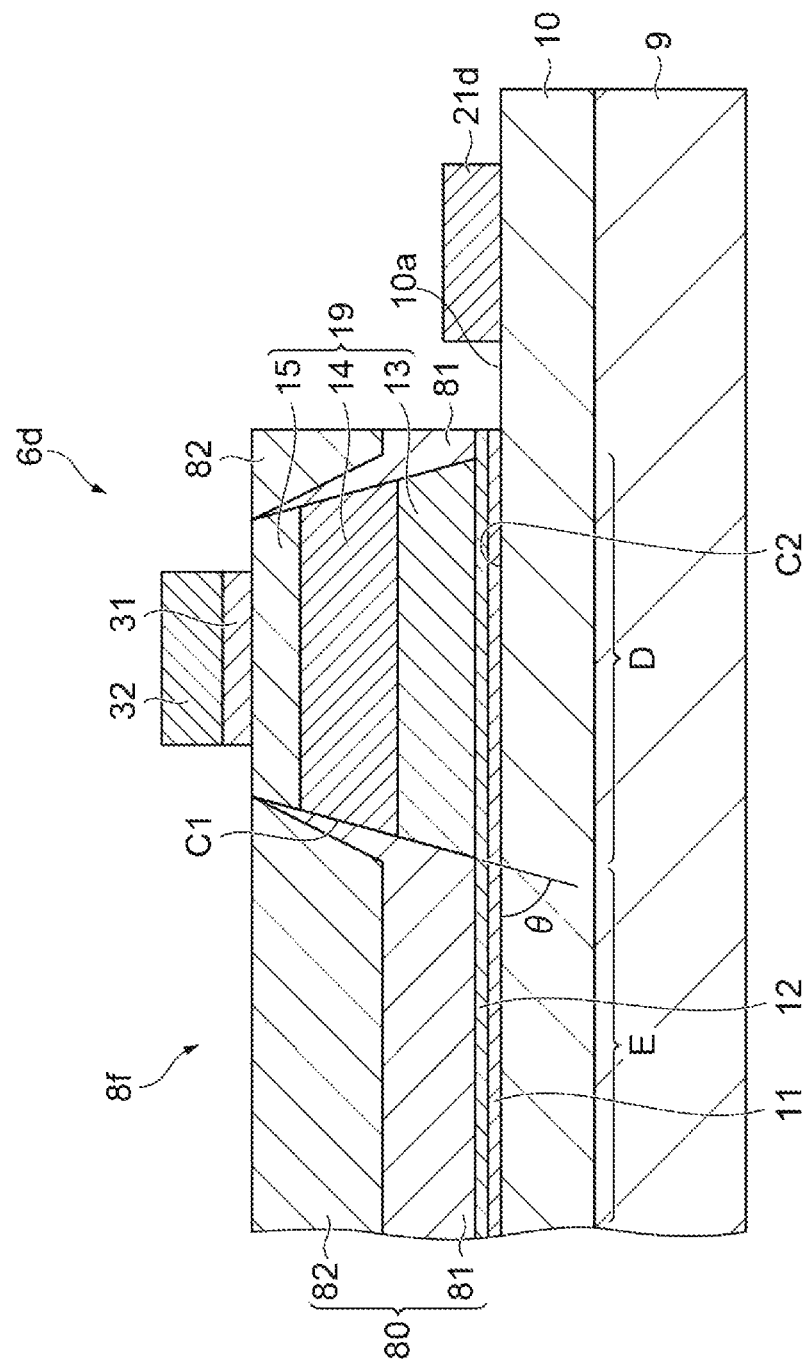
FIG. 5 is a view illustrating a cross section along line V-V illustrated in FIG. 1.

FIG. 1 is a plan view illustrating a configuration of a light receiving device including an optical waveguide type photodetector according to a first embodiment of the present disclosure. FIG. 2 illustrates a cross section along line II-II illustrated in FIG. 1, and FIG. 3 is an enlarged view illustrating a part of FIG. 2. FIG. 4 illustrates a cross section along line IV-IV illustrated in FIG. 1. FIG. 5 illustrates a cross section along line V-V illustrated in FIG. 1. In FIG. 5, illustration of insulating films 16 and 17 is omitted.

As illustrated in FIG. 1, a light receiving device 1A according to the present embodiment includes an optical waveguide type photodetector 2A and signal amplification units 3A and 3B. The photodetector 2A has a flat surface shape such as a substantially rectangular shape. For example, the photodetector 2A has a substrate made of a compound semiconductor such as InP, and an optical waveguide formed on the substrate. The photodetector 2A has two input ports 4a and 4b and an optical branching portion (optical coupler) 5. The photodetector 2A further has photodetector portions 6a, 6b, 6c, and 6d formed on the substrate, and capacitor portions 7a, 7b, 7c, and 7d. That is, the photodetector 2A has a structure in which the optical waveguide and the photodetector portions 6a, 6b, 6c, and 6d are monolithically integrated on a common substrate.

The photodetector 2A has end edges 2a and 2b extending in a predetermined direction A. The end edge 2a faces the end edge 2b in a direction B intersecting (for example, orthogonal to) the direction A. The two input ports 4a and 4b are provided at the end edge 2a of the photodetector 2A. An optical signal La is input to the input port 4a from outside of the light receiving device 1A. The optical signal La includes four signal components modulated by a quadrature phase shift keying (QPSK) method. A local oscillation light Lb is input to the input port 4b. The input port 4a is optically coupled to an optical branching portion 5 via an optical waveguide portion 8a. The input port 4b is optically coupled to the optical branching portion 5 via an optical waveguide portion 8b. The optical waveguide portions 8a and 8b are suitably constituted of a core layer and a cladding layer. The core layer is made of a material having a relatively large refractive index (for example, InGaAsP). The cladding layer is made of a material having a smaller refractive index (for example, InP) than the core layer and covers the core layer.

The optical branching portion 5 constitutes a 90° optical hybrid. The optical branching portion 5 is constituted of a multi-mode interference (MMI) coupler. The optical branching portion 5 causes the optical signal La and the local oscillation light Lb to interfere with each other. Accordingly, the optical signal La branches into four signal components Lc1, Lc2, Lc3, and Lc4 modulated by the QPSK method. A polarization state of the signal component Lc1 is equivalent to a polarization state of the signal component Lc2, and the signal component Lc1 and the signal component Lc2 have an in-phase relationship. A polarization state of the signal component Lc3 is equivalent to a polarization state of the signal component Lc4, and the polarization states of the signal components Lc3 and Lc4 differ from the polarization states of the signal components Lc1 and Lc2. The signal components Lc3 and Lc4 have a quadrature relationship.

Each of the photodetector portions 6a, 6b, 6c, and 6d has a configuration as an avalanche multiplication type PIN photodiode. The photodetector portions 6a, 6b, 6c, and 6d are disposed side by side in this order along the end edge 2b of the photodetector 2A. The photodetector portions 6a, 6b, 6c, and 6d are optically coupled to corresponding output ports of the optical branching portion 5 via optical waveguide portions 8c, 8d, 8e, and 8f, respectively. A uniform bias voltage is supplied to cathodes of the photodetector portions 6a, 6b, 6c, and 6d. Each of the photodetector portions 6a, 6b, 6c, and 6d receives each of the four signal components Lc1, Lc2, Lc3, and Lc4 from the optical branching portion 5 and generates an electrical signal (photoelectric current) corresponding to a light intensity of each of these signal components Lc1, Lc2, Lc3, and Lc4. Electrode pads 21a, 21b, 21c, and 21d are provided on the light receiving element 2A for outputting signals. The electrode pads 21a, 21b, 21c, and 21d are electrically connected to anodes of the photodetector portions 6a, 6b, 6c, and 6d. The electrode pads 21a, 21b, 21c, and 21d are provided side by side in the direction A along the end edge 2b of the photodetector 2A. Each of the electrode pads 21a, 21b, 21c, and 21d is electrically connected to each of electrode pads 61a, 61b, 61c, and 61d (for inputting signals) of the signal amplification units 3A and 3B via each of bonding wires 20a, 20b, 20c, and 20d.

The capacitor portions 7a, 7b, 7c, and 7d are so-called metal-insulator-metal (MIM) capacitors. The capacitor portions 7a, 7b, 7c, and 7d are constituted of a ground layer made of a semiconductor, a lower metal layer and an upper metal layer laminated on this ground layer, and an insulating film (the insulating film 17 illustrated in FIG. 2) interposed between the lower metal layer and the upper metal layer. For example, each of the lower metal layer and the upper metal layer has a laminated structure such as TiW/Au or Ti/Au/Pt. The capacitor portions 7a, 7b, 7c, and 7d are disposed side by side (adjacent to each other) in the direction A with respect to the respective photodetector portions 6a, 6b, 6c, and 6d on the photodetector 2A. Each of the capacitor portions 7a, 7b, 7c, and 7d is electrically connected between a bias wiring for supplying a bias voltage to each of the cathodes of the photodetector portions 6a, 6b, 6c, or 6d and a reference potential wiring (GND line). An opening of the insulating film 17 is provided on a part of the lower metal layer which is not covered by the upper metal layer. A bias wiring 42 (refer to FIG. 2) is provided on the lower metal layer exposed through the opening. The lower metal layer is electrically connected to the bias wiring 42. The reference potential (GND) wiring is provided on the upper metal layer.

The upper metal layer is electrically connected to the reference potential wiring. Due to each of the capacitor portions 7a, 7b, 7c, and 7d, an inductance component between each of the cathodes of the photodetector portions 6a, 6b, 6c, and 6d and a by-pass capacitor (not illustrated) can be aligned in a design aspect.

Each of the capacitor portions 7a, 7b, 7c, and 7d has each of electrode pads 22a, 22b, 22c, and 22d (for a bias voltage) connected to the lower metal layer, and each of electrode pads 23a, 23b, 23c, and 23d (for a reference potential) connected to the upper metal layer. The electrode pads 23a, 23b, 23c, and 23d are disposed between the electrode pads 22a, 22b, 22c, and 22d and the end edge 2b of the photodetector 2A in the direction B.

One end of each of bonding wires 20i, 20j, 20k, and 20m is connected to each of the electrode pads 22a, 22b, 22c, and 22d. The other end of each of the bonding wires 20i, 20j, 20k, and 20m is electrically connected to a bias voltage source (not illustrated). The bonding wires 20i, 20j, 20k, and 20m constitute parts of wirings for supplying a bias voltage to the respective photodetector portions 6a, 6b, 6c, and 6d.

One end of each of bonding wires 20e, 20f, 20g, and 20h is connected to each of the electrode pads 23a, 23b, 23c, and 23d. Each of the bonding wires 20e, 20f, 20g, and 20h is provided along each of the bonding wires 20a, 20b, 20c, and 20d. The other end of each of the bonding wires 20e, 20f, 20g, and 20h is connected to each of electrode pads 62a, 62c, 62d, and 62f for a reference potential of the signal amplification units 3A and 3B.

The signal amplification units 3A and 3B are amplifiers (trans impedance amplifiers: TIA) for amplifying an electrical signal (photoelectric current) output from the photodetector portions 6a, 6b, 6c, and 6d. The signal amplification unit 3A has two electrode pads 61a and 61b for inputting signals. The signal amplification unit 3A performs differential amplification of electrical signals input to the electrode pads 61a and 61b and generates one voltage signal. The signal amplification unit 3B has two electrode pads 61c and 61d for inputting signals. The signal amplification unit 3B performs differential amplification of electrical signals input to the electrode pads 61c and 61d and generates one voltage signal. The electrode pads 61a, 61b, 61c, and 61d are disposed side by side in this order along the end edge 2b of the photodetector 2A and in the direction A. As described above, each of the electrode pads 61a, 61b, 61c, and 61d is electrically connected to each of the electrode pads 21a, 21b, 21c, and 21d via each of the bonding wires 20a, 20b, 20c, and 20d.

The signal amplification unit 3A further has three electrode pads 62a, 62b, and 62c. The electrode pads 62a, 62b, and 62c are disposed side by side in this order along the end edge 2b of the photodetector 2A and in the direction A. The electrode pad 61a is disposed between the electrode pads 62a and 62b. The electrode pad 61b is disposed between the electrode pads 62b and 62c. Similarly, the signal amplification unit 3B further has three electrode pads 62d, 62e, and 62f. The electrode pads 62d, 62e, and 62f are disposed side by side in this order along the end edge 2b of the photodetector 2A and in the direction A. The electrode pad 61c is disposed between the electrode pads 62d and 62e. The electrode pad 61d is disposed between the electrode pads 62e and 62f. As described above, each of the electrode pads 62a, 62c, 62d, and 62f of the signal amplification units 3A and 3B is electrically connected to each of the electrode pads 23a, 23b, 23c, and 23d via each of the bonding wires 20e, 20f, 20g, and 20h.

FIG. 2 illustrates cross-sectional structures of two photodetector portions 6c and 6d of the four photodetector portions 6a, 6b, 6c, and 6d. FIG. 3 illustrates a cross-sectional structure of the photodetector portion 6d. The remaining photodetector portions 6a and 6b have a cross-sectional structure similar to this. FIG. 4 illustrates a cross-sectional structure of one optical waveguide portion 8f of six optical waveguide portions 8a, 8b, 8c, 8d, 8e, and 8f. The remaining optical waveguide portions 8a to 8e also have a cross-sectional structure similar to this. FIG. 5 illustrates a cross-sectional structure of a joint part between the photodetector portion 6d and the optical waveguide portion 8f. A joint part between the photodetector portion 6a and the optical waveguide portion 8c, a joint part between the photodetector portion 6b and the optical waveguide portion 8d, and a joint part between the photodetector portion 6c and the optical waveguide portion 8e also have a cross-sectional structure similar to this.

As illustrated in FIG. 5, the photodetector portions 6a, 6b, 6c, and 6d and the optical waveguide portions 8c, 8d, 8e, and 8f are integrated on a common substrate 9. For example, the substrate 9 is a semi-insulating InP substrate. The cross-sectional structures of the photodetector portions 6a, 6b, 6c, and 6d will be described by taking the photodetector portion 6d as an example. As illustrated in FIG. 3, the photodetector portion 6d has an n-type semiconductor layer 10 and a waveguide type photodiode structure 19. The n-type semiconductor layer 10 is provided on the substrate 9 and is of a high-concentration n-type conductive type. The photodiode structure 19 is provided on a region D (a second region, refer to FIG. 5) of the n-type semiconductor layer 10.

The photodiode structure 19 has an optical absorption layer 13, a p-type semiconductor layer 14, and a p-type contact layer 15. The optical absorption layer 13 is provided on the n-type semiconductor layer 10. The p-type semiconductor layer 14 is provided on the optical absorption layer 13 and is of a p-type conductive type. The p-type contact layer 15 is provided on the p-type semiconductor layer 14 and is of a p-type conductive type. Moreover, the photodiode structure 19 has a multiplication layer 11 and a p-type electric field control layer 12. The multiplication layer 11 is provided between the n-type semiconductor layer 10 and the optical absorption layer 13. The p-type electric field control layer 12 is provided between the multiplication layer 11 and the optical absorption layer 13. The n-type semiconductor layer 10 is a first semiconductor layer according to the present embodiment. The p-type semiconductor layer 14 is a second semiconductor layer according to the present embodiment. The p-type electric field control layer 12 is a third semiconductor layer according to the present embodiment.

The n-type semiconductor layer 10 comes into ohmic contact with an n-type ohmic electrode 41 (refer to FIG. 3). For example, the n-type semiconductor layer 10 is a Si-doped InP layer. For example, a Si-doping concentration of the n-type semiconductor layer 10 is $1 \times 10^{17}$ cm$^{-3}$ or higher. For example, a thickness of the n-type semiconductor layer 10 is within a range of 1 μm to 2 μm. The multiplication layer 11 is an electron injection type carrier multiplication layer. The multiplication layer 11 is of an i-type (undoped) conductive type or an n-type conductive type having a lower impurity concentration than the n-type semiconductor layer 10. For example, the multiplication layer 11 is a Si-doped InAlAs layer. For example, a Si-doping concentration of the multiplication layer 11 is $3 \times 10^{16}$ cm$^{-3}$ or lower. For example, a thickness of the multiplication layer 11 is within a range of 0.050 μm to 0.200 μm. The p-type electric field control layer 12 is a layer provided to lower an electric field of the optical absorption layer 13. The p-type electric field control layer 12 is of a p-type conductive type having a higher impurity concentration than the optical absorption layer 13. For example, the p-type electric field control layer 12 is a Zn-doped InP layer or a Zn-doped InAlGaAs layer. For example, a Zn-doping concentration of the p-type electric field control layer 12 is $1 \times 10^{18}$ cm$^{-3}$ or higher. For example, a thickness of the p-type electric field control layer 12 is within a range of 0.025 μm to 0.100 μm.

For example, the optical absorption layer 13 is an undoped InGaAs layer or a low-concentration p-type InGaAs layer of which the Zn-doping concentration is $3 \times 10^{16}$ cm$^{-3}$ or lower. For example, a thickness of the optical absorption layer 13 is within a range of 0.1 μm to 0.4 μm. For example, the p-type semiconductor layer 14 is a Zn-doped InP layer. For example, a Zn-doping concentration of the p-type semiconductor layer 14 is $2 \times 10^{17}$ cm$^{-3}$ or higher. For example, a thickness of the p-type semiconductor layer 14 is within a range of 1 μm to 2.5 μm. For example, the p-type contact layer 15 is a Zn-doped InGaAs layer. For example, a Zn-doping concentration of the p-type contact layer 15 is $1 \times 10^{18}$ cm$^{-3}$ or higher. For example, a thickness of the p-type contact layer 15 is within a range of 0.1 μm to 0.3 μm.

A composition graded layer may be provided between the optical absorption layer 13 and the p-type semiconductor layer 14 for alleviating hetero-energy barriers (ΔEv and ΔEc) between both layers. This composition graded layer is of an undoped conductive type or a p-type conductive type of which the Zn-doping concentration is $1 \times 10^{17}$ cm$^{-3}$ or lower. A p-type hetero-barrier alleviation layer may be provided between the p-type semiconductor layer 14 and the p-type contact layer 15. For example, this hetero-barrier alleviation layer is constituted of two Zn-doped InGaAsP layers of which the doping concentration is $1 \times 10^{18}$ cm$^{-3}$ or higher. For example, bandgap wavelengths of the two Zn-doped InGaAsP layers are 1.1 μm and 1.3 μm, respectively.

A part of the n-type semiconductor layer 10, the multiplication layer 11, the p-type electric field control layer 12, the optical absorption layer 13, the p-type semiconductor layer 14, and the p-type contact layer 15 constitute a stripe mesa structure extending in a predetermined optical waveguiding direction (the direction B of FIG. 1 in the present embodiment). The stripe mesa structure has a pair of side surfaces. The pair of side surfaces of this stripe mesa structure are embedded by an embedment region 18. For example, the embedment region 18 is formed of a semi-insulating material such as Fe-doped InP. For example, a width of the stripe mesa structure in a direction orthogonal to the optical waveguiding direction (the direction A in FIG. 1) is within a range of 1.5 μm to 3 μm. For example, a height of the stripe mesa structure is within a range of 2 μm to 3.5 μm.

The photodetector portion 6d further has the insulating films 16 and 17. The insulating films 16 and 17 are provided from an upper surface of the stripe mesa structure to a part on the embedment region 18. The insulating films 16 and 17 cover and protect the upper surface of the stripe mesa structure and the embedment region 18. For example, the insulating films 16 and 17 are films made of an insulating silicon compound such as SiN, SiON, or SiO$_2$. The insulating films 16 and 17 have an opening on the upper surface of the stripe mesa structure. A p-type ohmic electrode 31 is provided on the p-type contact layer 15 exposed from the insulating films 16 and 17 through the openings.

For example, the p-type ohmic electrode 31 is made of an alloy of AuZn or Pt and the p-type contact layer 15. A wiring 32 is provided on the p-type ohmic electrode 31. The wiring 32 extends in the optical waveguiding direction (the direction B in FIG. 1) and electrically connects the p-type ohmic electrode 31 and the electrode pad 21d to each other. For example, the wiring 32 has a laminated structure such as TiW/Au or Ti/Pt/Au. For example, the electrode pad 21d is formed through Au plating.

The insulating films 16 and 17 also have another opening on the n-type semiconductor layer 10 separated from the mesa structure of the photodetector portion 6d. The n-type ohmic electrode 41 serving as a cathode is provided on the n-type semiconductor layer 10 exposed from the insulating films 16 and 17 through the openings. For example, the n-type ohmic electrode 41 is made of an alloy of AuGe or AuGeNi and the n-type semiconductor layer 10. A bias wiring 42 is provided on the n-type ohmic electrode 41. The bias wiring 42 extends to the lower metal layer of the capacitor portion 7d and electrically connects the lower metal layer and the n-type ohmic electrode 41 to each other.

The capacitor portion 7d has the insulating film 16, the lower metal layer, the insulating film (interlayer film) 17, and the upper metal layer laminated in this order on the substrate 9. For example, the upper metal layer and the lower metal layer are constituted of a laminated structure such as TiW/Au or Ti/Au/Pt. On a part of the lower metal layer which is not covered by the upper metal layer, an opening is formed in the insulating film 17. The bias wiring 42 is provided on the lower metal layer exposed through the opening. The bias wiring 42 extends in a direction in which it becomes farther from the end edge 2b of the photodetector 2A in the optical waveguiding direction (the direction B in FIG. 1) and electrically connects the lower metal layer and the electrode pad 22d to each other. A wiring connected to the electrode pad 23d is provided on the upper metal layer. This wiring extends in a direction in which it becomes closer to the end edge 2b of the photodetector 2A in the optical waveguiding direction and electrically connects the upper metal layer and the electrode pad 23d to each other.

A via 51 is provided on the substrate 9. The via 51 is a metal conductive material and is formed through Au plating, for example. The via 51 is provided in a manner of penetrating the substrate 9 from a front surface to a rear surface. The upper metal layer of the capacitor portion 7d is electrically connected to one end of the via 51 on the front surface side via the electrode pad 23d. The other end of the via 51 on the rear surface side is connected to the reference potential line (ground potential line) shared between the signal amplification units 3A and 3B.

For example, the wiring connected to the electrode pad 23d, and the bias wiring 42 have a laminated structure such as TiW/Au or Ti/Au/Pt. For example, the electrode pad 23d and the electrode pad 22d are formed through Au plating.

Subsequently, a cross-sectional structure of the optical waveguide portion will be described. As illustrated in FIGS. 4 and 5, the optical waveguide portion 8f includes the n-type semiconductor layer 10 and an optical waveguide structure 80. The n-type semiconductor layer 10 is provided on the substrate 9. The optical waveguide structure 80 is provided on a region E (first region) of the n-type semiconductor layer 10. The region E is adjacent to the region D of the n-type semiconductor layer 10 in the optical waveguiding direction (the direction B in FIG. 1). The optical waveguide structure 80 includes an optical waveguiding core layer 81 provided on the n-type semiconductor layer 10, and a cladding layer 82 provided on the optical waveguiding core layer 81.

Moreover, the optical waveguide portion 8f includes the multiplication layer 11 and the p-type electric field control layer 12 provided between the n-type semiconductor layer 10 and the optical waveguide structure 80.

The n-type semiconductor layer 10 is in common with the n-type semiconductor layer 10 of the photodetector portion 6d and functions as a lower cladding layer in the optical waveguide portion 8f. The n-type semiconductor layer 10 is provided from the photodetector portion 6d to the optical waveguide portion 8f on the substrate 9. Similarly, the multiplication layer 11 on a region E is shared by the multiplication layer 11 of the photodetector portion 6d, and the p-type electric field control layer 12 on a region E is shared by the p-type electric field control layer 12 of the photodetector portion 6d. The multiplication layer 11 and the p-type electric field control layer 12 extend from between the region D of the n-type semiconductor layer 10 and the optical absorption layer 13 to a part between the region E of the n-type semiconductor layer 10 and the optical waveguiding core layer 81. In the present embodiment, the multiplication layer 11 and the p-type electric field control layer 12 between the region E of the n-type semiconductor layer 10 and the optical waveguiding core layer 81 are provided throughout an entire area of the optical waveguide structure 80 (that is, an entire area of the optical waveguide portions 8a, 8b, 8c, 8d, 8e, and 8f viewed in the lamination direction). The composition, the doping concentration, and the thickness of the n-type semiconductor layer 10, the multiplication layer 11, and the p-type electric field control layer 12 in the optical waveguide portions 8a, 8b, 8c, 8d, 8e, and 8f are the same as those of the photodetector portion 6d.

As illustrated in FIG. 5, the optical waveguide portion 8f is subjected to butt joint coupling to the photodetector portion 6d, and the optical waveguiding core layer 81 comes into contact with the optical absorption layer 13. Accordingly, the optical waveguiding core layer 81 is optically coupled to the optical absorption layer 13. For example, a butt joint interface is formed through wet etching. Hence, the butt joint interface is inclined with respect to a direction perpendicular to an upper surface 10a of the n-type semiconductor layer 10, that is, an interface between the n-type semiconductor layer 10 and the multiplication layer 11. In other words, when an interface between the optical waveguide structure 80 and the photodiode structure 19 is a first interface C1 and an interface between the region D of the n-type semiconductor layer 10 and the photodiode structure 19 is a second interface C2, an angle θ formed by the first interface C1 and the second interface C2 is smaller than 90°. For example, the angle θ formed by the first interface C1 and the second interface C2 is within a range of 25° to 60°.

The optical waveguiding core layer 81 has a larger refractive index than the n-type semiconductor layer 10 and is formed of a material which can be subjected to lattice matching with the n-type semiconductor layer 10. For example, the optical waveguiding core layer 81 is made of InGaAsP. For example, a bandgap wavelength of InGaAsP of the optical waveguiding core layer 81 is 1.05 µm. For example, a thickness of the optical waveguiding core layer 81 is within a range of 0.3 µm to 0.5 µm. The cladding layer 82 has a smaller refractive index than the optical waveguiding core layer 81 and is formed of a material which can be subjected to lattice matching with the optical waveguiding core layer 81. For example, the cladding layer 82 is made of undoped InP. For example, a thickness of the cladding layer 82 is within a range of 1 µm to 3 µm. A height of an upper surface of the cladding layer 82 is aligned with a height of an upper surface of the p-type contact layer 15. As illustrated in FIG. 4, a part of the n-type semiconductor layer 10, the multiplication layer 11, the p-type electric field control layer 12, the optical waveguiding core layer 81, and the cladding layer 82 constitute a mesa structure extending in the optical waveguiding direction (the direction B in FIG. 1). An optical signal is confined inside the optical waveguiding core layer 81 due to this mesa structure and a difference between refractive indices of the n-type semiconductor layer 10, the cladding layer 82, and the optical waveguiding core layer 81. So that the optical signal can be propagated to the photodetector portion 6d. The side surfaces and the upper surface of this stripe mesa structure are protected by being covered by the two insulating films 16 and 17.

Effects obtained by the photodetector 2A of the present embodiment having the foregoing configuration will be described. In the photodetector 2A, the photodiode structure 19 includes the multiplication layer 11 and the p-type electric field control layer 12. The multiplication layer 11 is a carrier multiplication layer provided between the n-type semiconductor layer 10 and the optical absorption layer 13. The multiplication layer 11 is of an n-type conductive type having a lower impurity concentration than the n-type semiconductor layer 10 or is an undoped layer. The p-type electric field control layer 12 is an electric field lowering layer provided between the multiplication layer 11 and the optical absorption layer 13 and has a higher impurity concentration than the optical absorption layer 13. Since the photodiode structure 19 includes the multiplication layer 11 and the p-type electric field control layer 12 described above, the photodiode structure 19 having an avalanche multiplication action can be obtained.

Figure 6:
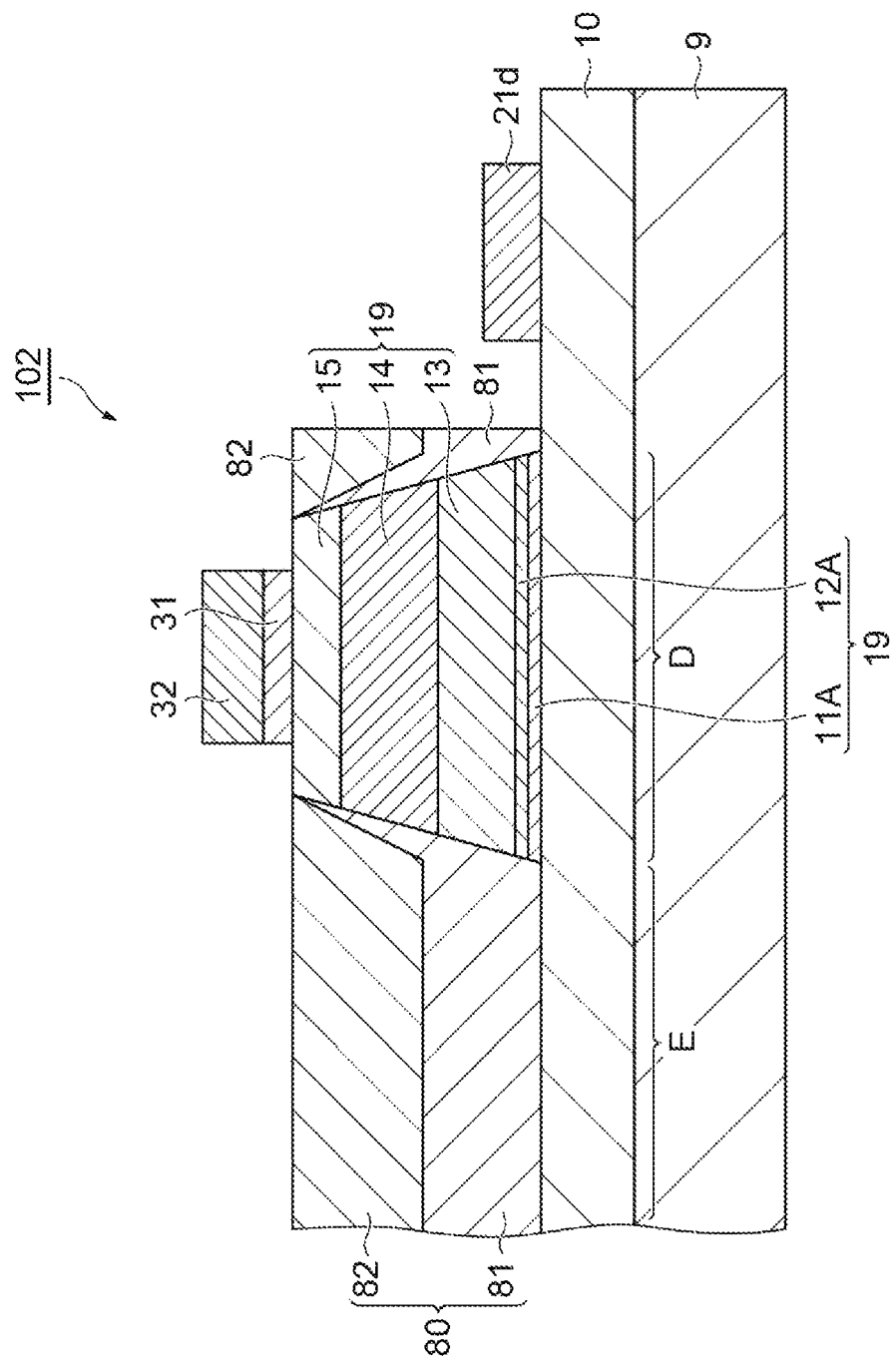
FIG. 6 is a cross-sectional view illustrating a structure of an optical waveguide type photodetector as a comparative example and illustrates a cross section corresponding to line V-V in FIG. 1.

FIG. 6 is a cross-sectional view illustrating a structure of an optical waveguide type photodetector 102 as a comparative example and illustrates a cross section corresponding to line V-V in FIG. 1. The optical waveguide type photodetector 102 has a multiplication layer 11A for avalanche multiplication and a p-type electric field control layer 12A between the optical absorption layer 13 constituting the photodiode structure 19 and the n-type semiconductor layer 10 thereunder. The multiplication layer 11A and the p-type electric field control layer 12A are provided in only the photodetector portion and are not provided in the optical waveguide portion.

In many cases, since the butt joint interface is formed through wet etching, it becomes a forward mesa structure and is inclined to the photodiode side with respect to a direction perpendicular to a main surface of the substrate 9. Therefore, an end face of the multiplication layer 11A are also inclined in a similar manner. FIG. 7A is an enlarged view of a part in the vicinity of the end face of the multiplication layer 11A in such a case. A region surrounded by the dotted line in the diagram shows a depleted region. When a end face 11j of the multiplication layer 11A is inclined, a length of an interface between the p-type electric field control layer 12A and the multiplication layer 11A in the optical waveguiding direction becomes shorter than a length of an interface between the n-type semiconductor layer 10 and the multiplication layer 11A in the same direction in accordance with an inclination angle thereof. Hence, when a reverse bias is applied, negative electric charges become insufficient in a region in the vicinity of the end face 11j of the multiplication layer 11A. As a result, depletion does not proceed compared to other parts in the multiplication layer 11A, and a depletion range Ws of the part becomes narrow compared to a depletion range Wc of other parts in the multiplication layer 11A.

FIG. 7B is a view illustrating change in electric field intensity in the thickness direction. The graph G11 shows change in electric field intensity of a part in the vicinity of the end face 11j of the multiplication layer 11A. The graph G12 shows change in electric field intensity of other parts in the multiplication layer 11A. As illustrated in FIG. 7B, due to the relationship between the foregoing depletion ranges Ws and Wc, a maximum electric field Emax1 in a part in the vicinity of the end face 11j of the multiplication layer 11A becomes larger than a maximum electric field Emax2 of other parts in the multiplication layer 11A. Therefore, edge breakdown is likely to occur in the butt joint interface. Furthermore, a multiplication current is concentrated in a part in the vicinity of the end face 11j, and thus reliability deteriorates.

Figure 8A:
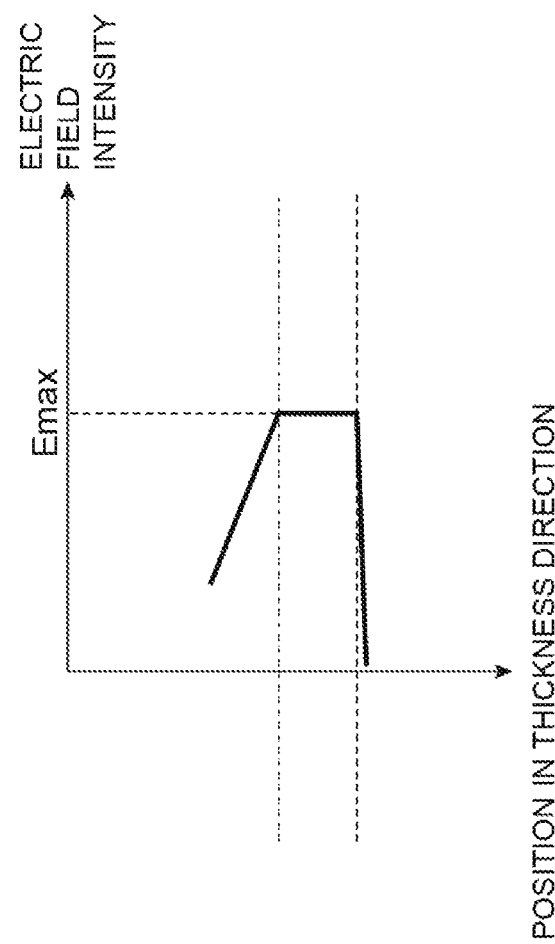
FIG. 8A is an enlarged view of a part in the vicinity of the end face of the multiplication layer in the first embodiment.

In the photodetector 2A of the present embodiment, the multiplication layer 11 and the p-type electric field control layer 12 extend from between the region D of the n-type semiconductor layer 10 and the optical absorption layer 13 to a part between the region E of the n-type semiconductor layer 10 and the optical waveguiding core layer 81. FIG. 8A is an enlarged view of a part in the vicinity of the end face of the multiplication layer 11 in such a case. A region surrounded by the dotted line in the diagram shows a depleted region. When the multiplication layer 11 and the p-type electric field control layer 12 extend between the region E of the n-type semiconductor layer 10 and the optical waveguiding core layer 81, as illustrated in the diagram, a difference between a length of an interface between the p-type electric field control layer 12 and the multiplication layer 11 in the optical waveguiding direction and a length of the interface between the n-type semiconductor layer 10 and the multiplication layer 11 in the same direction is resolved. Hence, the depletion range is made approximately uniform to the butt joint interface, and unevenness of the depletion range caused by inclination of the end face 11j is reduced. That is, according to the photodetector 2A of the present embodiment, the depletion range of the multiplication layer 11 can be made approximately uniform.

Figure 8B:
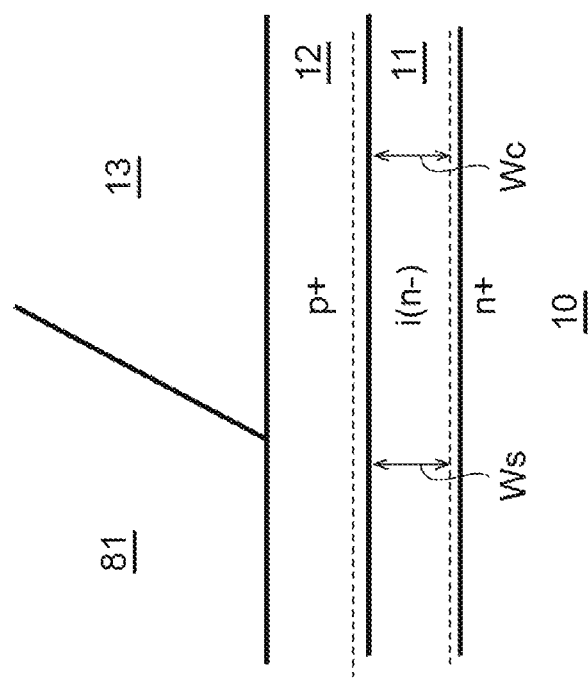
FIG. 8B is a view illustrating change in electric field intensity of the multiplication layer in the thickness direction.

FIG. 8B is a view illustrating change in electric field intensity of the multiplication layer 11 in the thickness direction. According to the present embodiment, a maximum electric field Emax in the vicinity of the end face 11j of the multiplication layer 11 becomes equivalent to a maximum electric field of other parts in the multiplication layer 11.

That is, partial increase in maximum electric field Emax in the multiplication layer 11 can be curbed. Therefore, edge breakdown can be made unlikely to occur. Furthermore, deterioration in reliability due to concentration of a multiplication current can be avoided.

As in the present embodiment, the multiplication layer 11 and the p-type electric field control layer 12 between the region E of the n-type semiconductor layer 10 and the optical waveguiding core layer 81 may be provided throughout the entire area of the optical waveguide structure 80. In such a case, when the photodetector 2A is manufactured, it is only necessary to cause the multiplication layer 11 and the p-type electric field control layer 12 to grow on the entire surface of the n-type semiconductor layer 10, and thus manufacturing steps can be simplified.

(First Modification)

Figure 9:
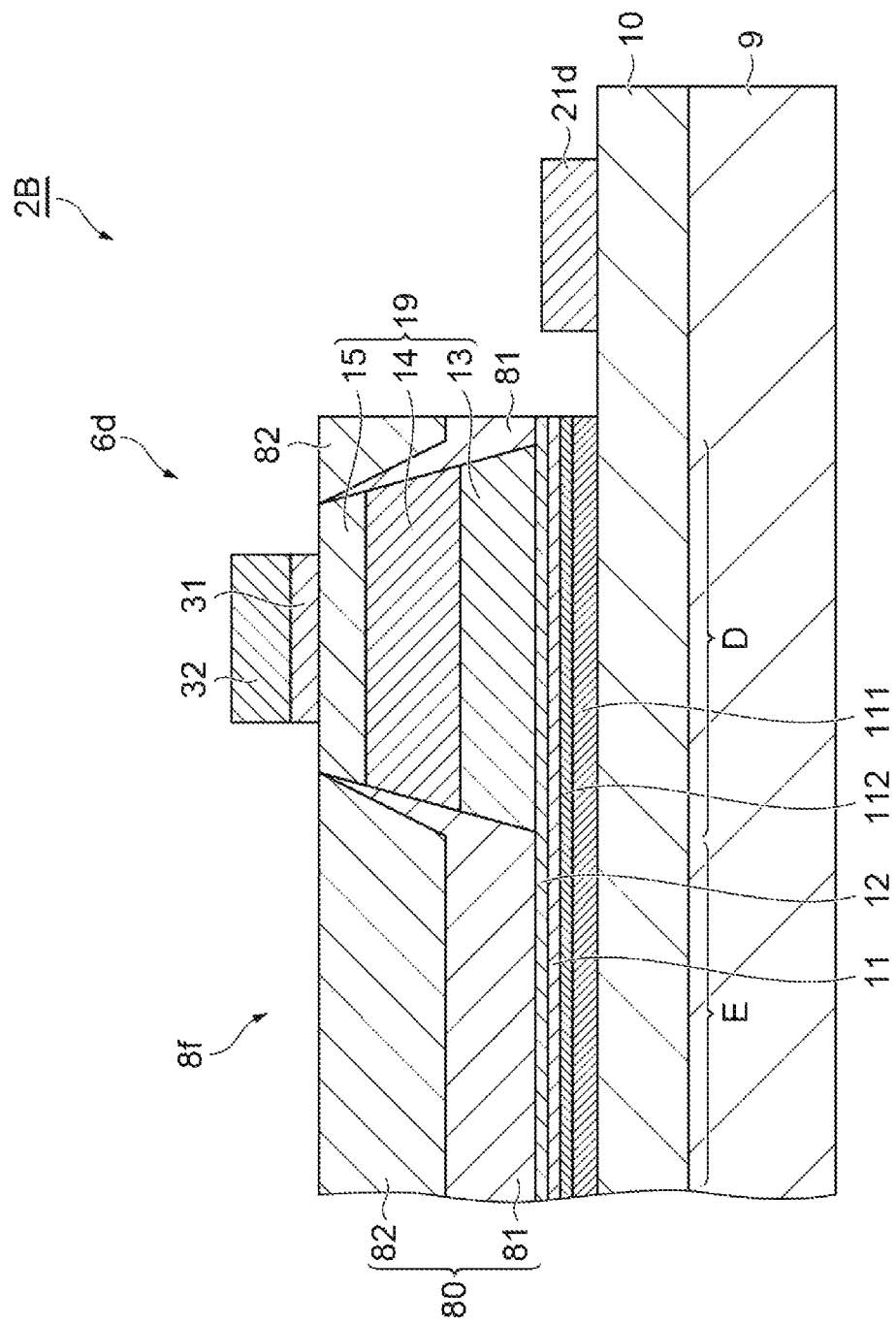
FIG. 9 is a cross-sectional view illustrating a structure of an optical waveguide type photodetector according to a first modification and illustrates a cross section corresponding to line V-V in FIG. 1.

FIG. 9 is a cross-sectional view illustrating a structure of an optical waveguide type photodetector 2B according to a first modification of the foregoing embodiment and illustrates a cross section corresponding to line V-V in FIG. 1. In addition to the configuration of the photodetector 2A of foregoing embodiment, the photodetector 2B further includes a buffer layer 111 and an n-type electric field control layer 112.

The buffer layer 111 is provided between the n-type semiconductor layer 10 and the multiplication layer 11. The buffer layer 111 extends from a part on the region D of the n-type semiconductor layer 10 to a part on the region E of the n-type semiconductor layer 10. The buffer layer 111 is of an n-type conductive type having a lower impurity concentration than the n-type semiconductor layer 10 or is an undoped layer. For example, the buffer layer 111 is a Si-doped InP layer. For example, a Si-doping concentration of the buffer layer 111 is $1 \times 10^{16}$ cm$^{-3}$ or lower. For example, a thickness of the buffer layer 111 is within a range of 0.050 μm to 0.200 μm. In the optical waveguide portion, the buffer layer 111 functions as a second lower cladding layer.

The n-type electric field control layer 112 is a layer provided to lower an electric field of the buffer layer 111. The n-type electric field control layer 112 is a fourth semiconductor layer in the present modification. The n-type electric field control layer 112 is provided between the buffer layer 111 and the multiplication layer 11. The n-type electric field control layer 112 extends together with the buffer layer 111 from a part on the region D of the n-type semiconductor layer 10 to a part on the region E of the n-type semiconductor layer 10. The impurity concentration of the n-type electric field control layer 112 is higher than that of the multiplication layer 11, for example, is $1 \times 10^{18}$ cm$^{-3}$ or higher. For example, the n-type electric field control layer 112 is a Si-doped InP layer.

In the present modification, due to the n-type electric field control layer 112, the depletion range can expand by controlling the electric field intensity of the buffer layer 111 at the time of applying a reverse bias voltage to the extent that multiplication of carriers does not occur. Hence, a CR time constant of the photodetector portion can be further reduced. As a result, faster (broadband) high-frequency response characteristics can be realized.

(Second Modification)

Figure 10:
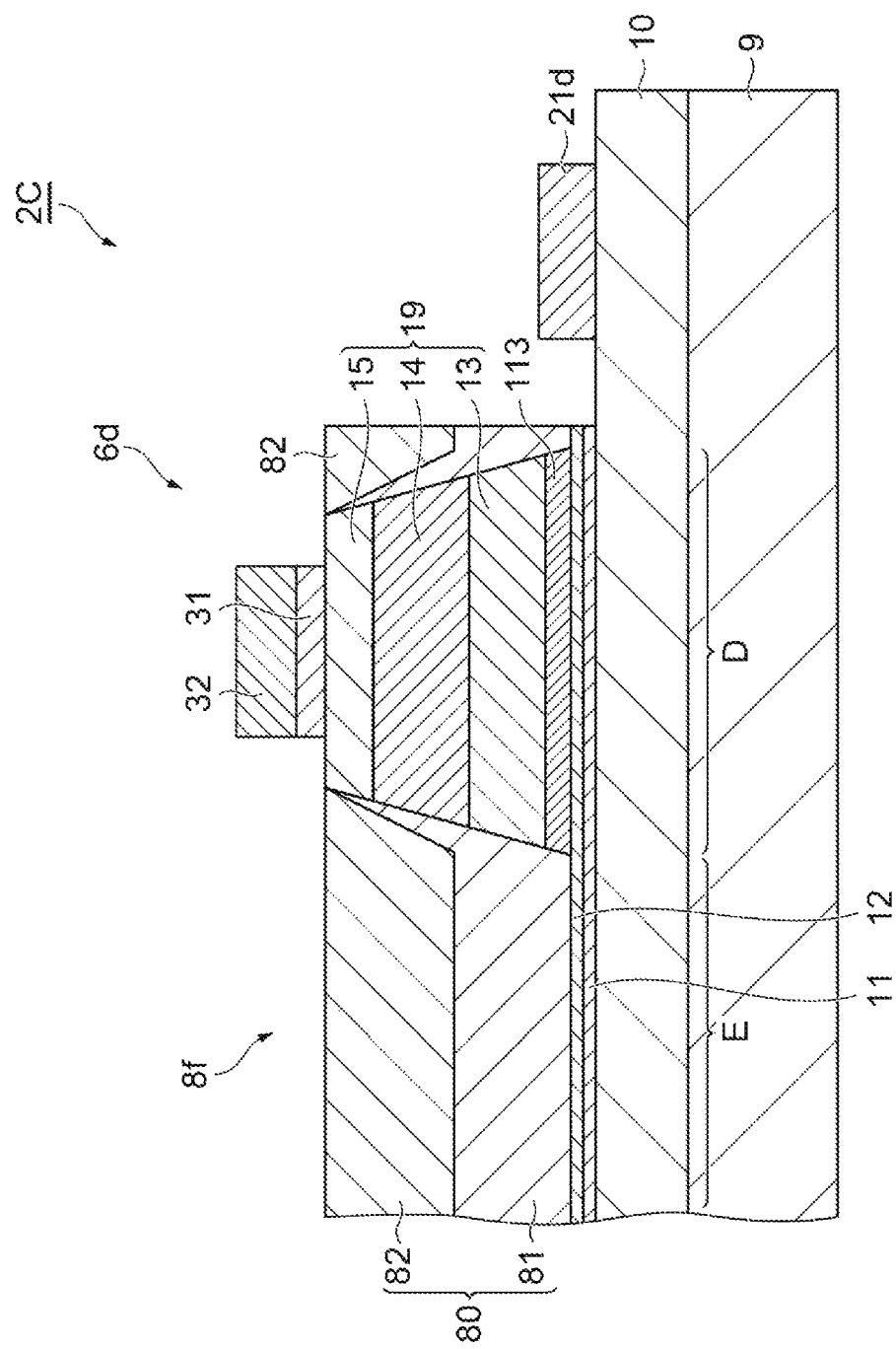
FIG. 10 is a cross-sectional view illustrating a structure of an optical waveguide type photodetector according to a second modification and illustrates a cross section corresponding to line V-V in FIG. 1.

FIG. 10 is a cross-sectional view illustrating a structure of an optical waveguide type photodetector 2C according to a second modification of the foregoing embodiment and illustrates a cross section corresponding to line V-V in FIG. 1. In addition to the configuration of the photodetector 2A of foregoing embodiment, the photodetector 2C further includes a hetero-barrier alleviation layer 113. The hetero-barrier alleviation layer 113 is a fifth semiconductor layer in the present modification. The hetero-barrier alleviation layer 113 is provided only between the p-type electric field control layer 12 and the optical absorption layer 13 on the region D of the n-type semiconductor layer 10 and does not extend to a part on the region E of the n-type semiconductor layer 10. The hetero-barrier alleviation layer 113 is provided to alleviate the hetero-energy barrier between the p-type electric field control layer 12 and the optical absorption layer 13.

The hetero-barrier alleviation layer 113 is of a p-type conductive type having a lower impurity concentration than the p-type electric field control layer 12 or is an undoped layer. A bandgap of the hetero-barrier alleviation layer 113 is between a bandgap of the p-type electric field control layer 12 and a bandgap of the optical absorption layer 13. For example, the hetero-barrier alleviation layer 113 is a Zn-doped InGaAsP layer. For example, a bandgap wavelength of the hetero-barrier alleviation layer 113 is 1.25 μm or 1.40 μm. Alternatively, the hetero-barrier alleviation layer 113 may be a composition graded layer in which the bandgap wavelength continuously varies. For example, a Si-doping concentration of the hetero-barrier alleviation layer 113 is $1 \times 10^{17}$ cm$^{-3}$ or lower. For example, a thickness of the hetero-barrier alleviation layer 113 is within a range of 0.025 μm to 0.100 μm.

In the present modification, a center position of the optical absorption layer 13 in the thickness direction can be accurately aligned with a center position of the optical waveguiding core layer 81 in the thickness direction by adjusting a thickness of the hetero-barrier alleviation layer 113. Hence, even when the optical absorption layer 13 is thinned to increase the operating speed of the photodetector 2C, a coupling loss between the optical absorption layer 13 and the optical waveguiding core layer 81 can be reduced by matching a mode field of the optical absorption layer 13 and a mode field of the optical waveguiding core layer 81. As a result, both reduction of a coupling loss and high sensitivity can be achieved.

(Third Modification)

Figure 11:
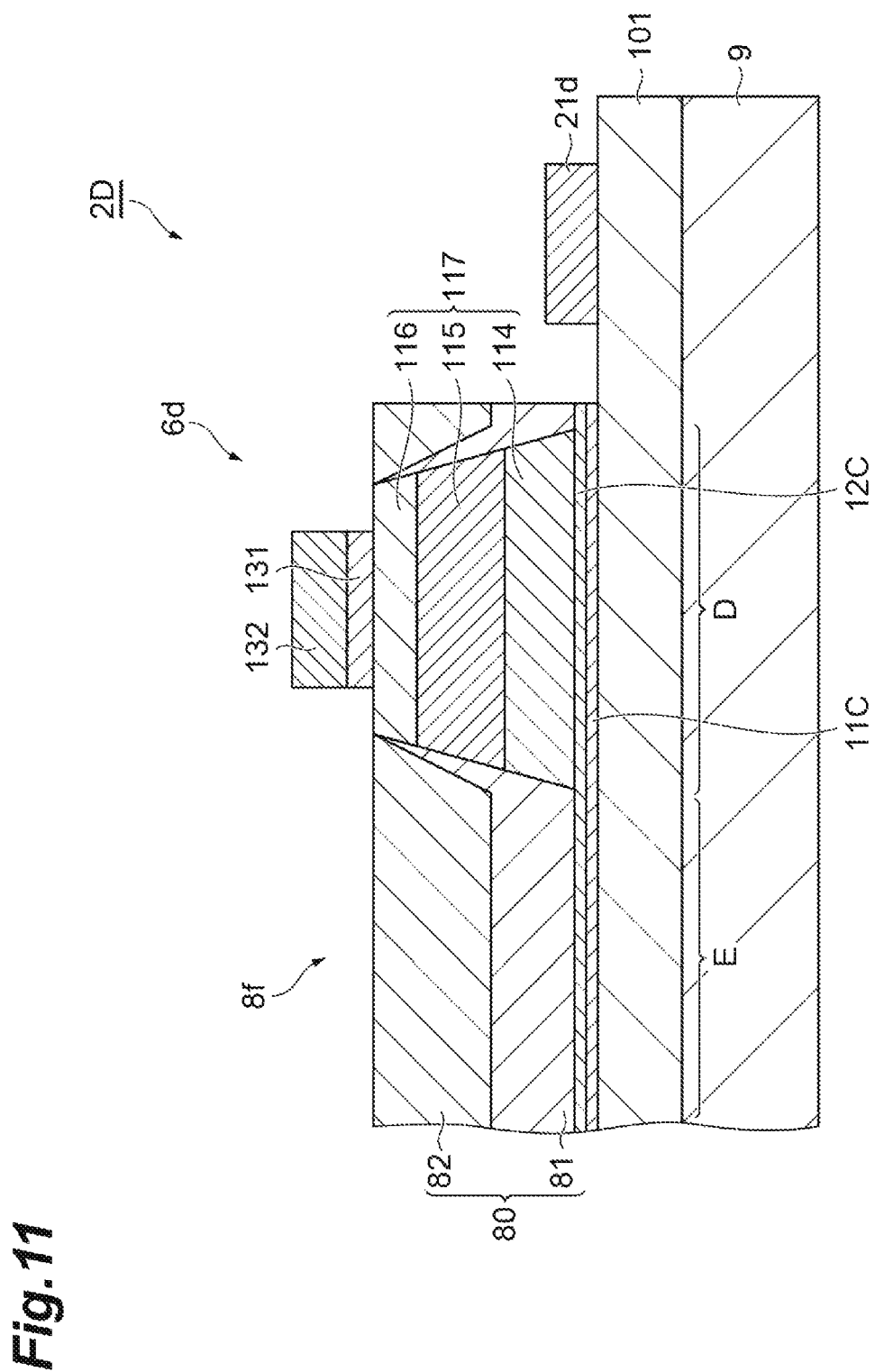
FIG. 11 is a cross-sectional view illustrating a structure of an optical waveguide type photodetector according to a third modification and illustrates a cross section corresponding to line V-V in FIG. 1.

FIG. 11 is a cross-sectional view illustrating a structure of an optical waveguide type photodetector 2D according to a third modification of the foregoing embodiment and illustrates a cross section corresponding to line V-V in FIG. 1. The photodetector 2D has a configuration in which the electron injection type multiplication layer 11 of the foregoing embodiment is changed to a hole injection type multiplication layer 11C. Except for the points which will be described below, a configuration of the photodetector 2D is similar to that of the photodetector 2A of foregoing embodiment.

The photodetector portion 6d of the photodetector 2D has a p-type semiconductor layer 101 and a waveguide type photodiode structure 117. The p-type semiconductor layer 101 is provided on the substrate 9 and is of a high-concentration p-type conductive type. The photodiode structure 117 is provided on the region D of the p-type semiconductor layer 101. The photodiode structure 117 has an optical absorption layer 114 provided on the p-type semiconductor layer 101, an n-type semiconductor layer 115 of an n-type conductive type provided on the optical absorption layer 114, and an n-type contact layer 116 provided on the n-type semiconductor layer 115. Moreover, the photodiode structure 117 has the multiplication layer 11C and an n-type electric field control layer 12C. The multiplication layer 11C is provided between the p-type semiconductor layer 101 and the optical absorption layer 114. The n-type electric field control layer 12C is provided between the multiplication layer 11C and the optical absorption layer 114. The p-type semiconductor layer 101 is a first semiconductor layer according to the present embodiment. The n-type semiconductor layer 115 is a second semiconductor layer according to the present embodiment. The n-type electric field control layer 12C is a third semiconductor layer according to the present embodiment.

The p-type semiconductor layer 101 comes into ohmic contact with an p-type ohmic electrode (not illustrated). For example, the p-type semiconductor layer 101 is a Zn-doped InP layer. For example, a Zn-doping concentration of the p-type semiconductor layer 101 is $1 \times 10^{18}$ cm$^{-3}$ or higher. For example, a thickness of the p-type semiconductor layer 101 is within a range of 1 μm to 2 μm. The multiplication layer 11C is a hole injection type carrier multiplication layer and is of an i-type (undoped) conductive type. For example, the multiplication layer 11C is an undoped InP layer. For example, a thickness of the multiplication layer 11C is within a range of 0.050 μm to 0.200 μm. The n-type electric field control layer 12C is provided to lower an electric field of the optical absorption layer 114. The n-type electric field control layer 12C is of an n-type conductive type having a higher impurity concentration than the optical absorption layer 114. For example, the n-type electric field control layer 12C is a Si-doped InP layer or a Si-doped InAlGaAs layer. For example, a Si-doping concentration of the n-type electric field control layer 12C is $1\times10^{18}$ cm$^{-3}$ or higher. For example, a thickness of the n-type electric field control layer 12C is within a range of 0.025 μm to 0.100 μm.

For example, the optical absorption layer 114 is an undoped InGaAs layer or a low-concentration n-type InGaAs layer of which the Si-doping concentration is $3\times10^{16}$ cm$^{-3}$ or lower. For example, a thickness of the optical absorption layer 114 is within a range of 0.1 μm to 0.4 μm. For example, the n-type semiconductor layer 115 is a Si-doped InP layer. For example, a Si-doping concentration of the n-type semiconductor layer 115 is $2\times10^{17}$ cm$^{-3}$ or higher. For example, a thickness of the n-type semiconductor layer 115 is within a range of 1 μm to 2.5 μm. For example, the n-type contact layer 116 is a Si-doped InGaAs layer. For example, a Si-doping concentration of the n-type contact layer 116 is $1\times10^{18}$ cm$^{-3}$ or higher. For example, a thickness of the n-type contact layer 116 is within a range of 0.1 μm to 0.3 μm. An n-type ohmic electrode 131 is provided on the n-type contact layer 116.

A composition graded layer may be provided between the optical absorption layer 114 and the n-type semiconductor layer 115 for alleviating hetero-energy barriers ($\Delta$Ev and $\Delta$Ec) between both layers. The composition graded layer is of an undoped conductive type or an n-type conductive type of which the Si-doping concentration is $1\times10^{17}$ cm$^{-3}$ or lower. An n-type hetero-barrier alleviation layer may be provided between the n-type semiconductor layer 115 and the n-type contact layer 116. For example, the hetero-barrier alleviation layer is constituted of two Si-doped InGaAsP layers of which the doping concentration is $1\times10^{18}$ cm$^{-3}$ or higher. For example, bandgap wavelengths of the two Si-doped InGaAsP layers are 1.1 μm and 1.3 μm, respectively.

A part of the p-type semiconductor layer 101, the multiplication layer 11C, the n-type electric field control layer 12C, the optical absorption layer 114, the n-type semiconductor layer 115, and the n-type contact layer 116 constitute a stripe mesa structure extending in the optical waveguiding direction. The stripe mesa structure has a pair of side surfaces. The pair of side surfaces of the stripe mesa structure are embedded by the embedment region 18 (refer to FIG. 3). For example, the embedment region 18 is formed of a semi-insulating material such as Fe-doped InP.

For example, the n-type ohmic electrode 131 is made of an alloy of AuZn or Pt and the n-type contact layer 116. A wiring 132 is provided on the n-type ohmic electrode 131. The wiring 132 extends in the optical waveguiding direction and electrically connects the n-type ohmic electrode 131 and the electrode pad 21d to each other. For example, the wiring 132 has a laminated structure such as TiW/Au or Ti/Pt/Au.

The p-type semiconductor layer 101 is provided from the photodetector portion 6d to the optical waveguide portion 8f on the substrate 9. The multiplication layer 11C on the region E is in common with the multiplication layer 11C of the photodetector portion 6d. The n-type electric field control layer 12C on the region E is in common with the n-type electric field control layer 12C of the photodetector portion 6d. The multiplication layer 11C and the n-type electric field control layer 12C extend from between the region D of the p-type semiconductor layer 101 and the optical absorption layer 114 to a part between the region E of the p-type semiconductor layer 101 and the optical waveguiding core layer 81. Also in the present embodiment, the multiplication layer 11C and the n-type electric field control layer 12C between the region E of the p-type semiconductor layer 101 and the optical waveguiding core layer 81 are provided throughout the entire area of the optical waveguide structure 80 (that is, the entire area of the optical waveguide portions 8a, 8b, 8c, 8d, 8e, and 8f viewed in the lamination direction). The composition, the doping concentration, and the thickness of the p-type semiconductor layer 101, the multiplication layer 11C, and the n-type electric field control layer 12C in the optical waveguide portions 8a, 8b, 8c, 8d, 8e, and 8f are the same as those of the photodetector portion 6d.

In the foregoing embodiment, the electron injection type multiplication layer 11 in which an ionization rate ($\alpha$) of electrons is larger than an ionization rate ($\beta$) of holes has been described as an example. As in the present modification, even in a configuration including the hole injection type multiplication layer 11C in which $\beta$ is larger than $\alpha$, effects similar to those of the foregoing embodiment can be exhibited.

Second Embodiment

Figure 12:
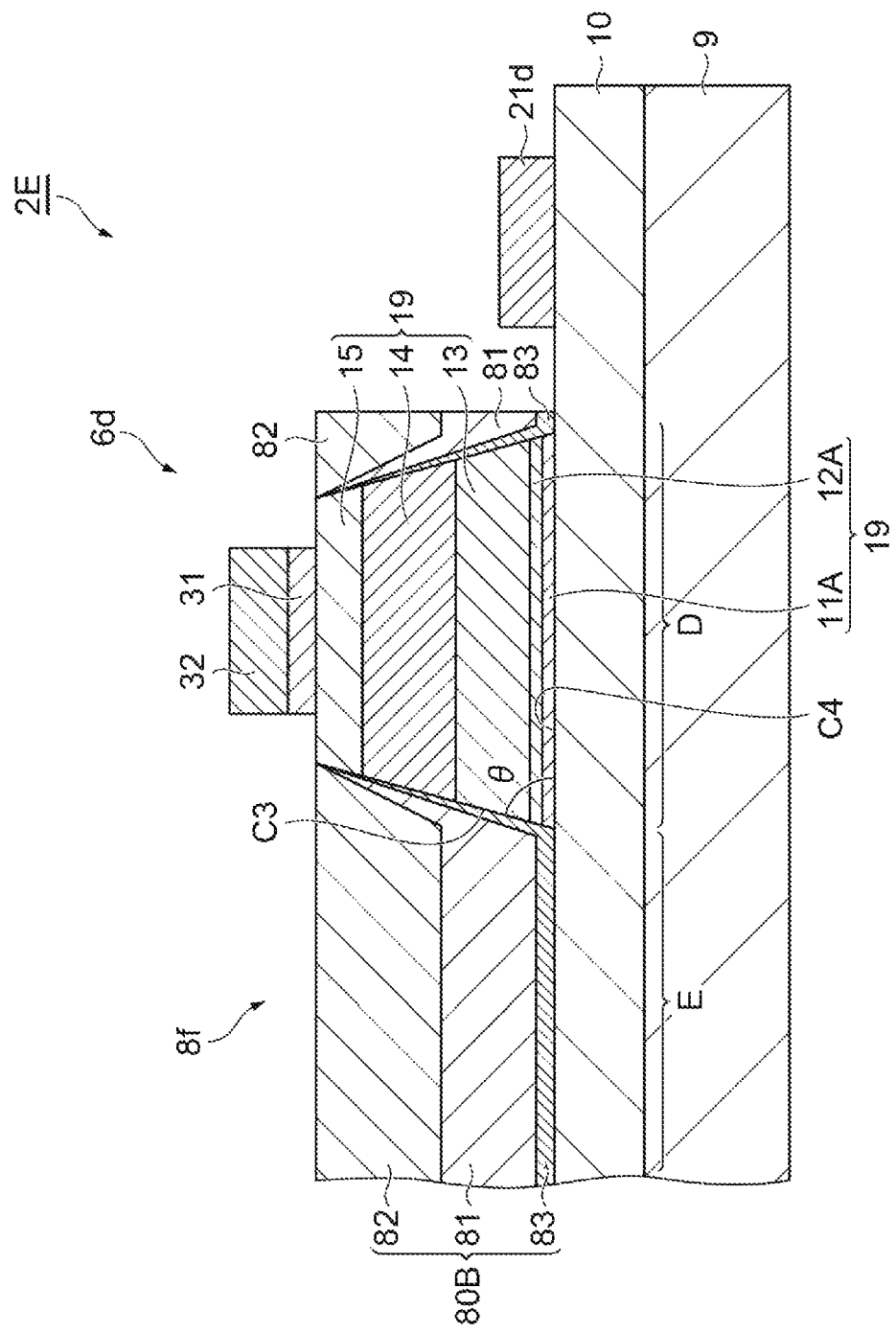
FIG. 12 is a cross-sectional view illustrating a structure of an optical waveguide type photodetector according to a second embodiment and illustrates a cross section corresponding to line V-V in FIG. 1.

FIG. 12 is a cross-sectional view illustrating a structure of an optical waveguide type photodetector 2E according to a second embodiment and illustrates a cross section corresponding to line V-V in FIG. 1. In place of the multiplication layer 11 and the p-type electric field control layer 12 of the first embodiment, the photodetector 2E includes the multiplication layer 11A and the p-type electric field control layer 12A. The multiplication layer 11A has the same composition and thickness as the multiplication layer 11 of the first embodiment. The multiplication layer 11A is provided only between the region D of the n-type semiconductor layer 10 and the optical absorption layer 13 and does not extend to a part between the region E of the n-type semiconductor layer 10 and the optical waveguiding core layer 81. The p-type electric field control layer 12A has the same composition and thickness as the p-type electric field control layer 12 of the first embodiment. The p-type electric field control layer 12A is provided only between the region D of the n-type semiconductor layer 10 and the optical absorption layer 13 and does not extend to a part between the region E of the n-type semiconductor layer 10 and the optical waveguiding core layer 81. The p-type electric field control layer 12A is a seventh semiconductor layer in the present modification.

The photodetector 2E further includes a p-type semiconductor layer 83. The p-type semiconductor layer 83 is a sixth semiconductor layer in the present modification. The p-type semiconductor layer 83 is provided on the region E of the n-type semiconductor layer 10, and the optical waveguiding core layer 81 is provided on the p-type semiconductor layer 83. That is, the p-type semiconductor layer 83 is provided between the region E of the n-type semiconductor layer 10 and the optical waveguiding core layer 81. The optical waveguiding core layer 81, the cladding layer 82, and the p-type semiconductor layer 83 constitute an optical waveguide structure 80B according to the present embodiment.

The optical waveguiding core layer 81 is optically coupled to the optical absorption layer 13. For example, a butt joint interface between the optical waveguide structure 80B and the photodiode structure 19 is formed through wet etching. Hence, the butt joint interface is inclined with respect to a direction perpendicular to an upper surface of the n-type semiconductor layer 10 (that is, an interface between the n-type semiconductor layer 10 and the multiplication layer 11A). In other words, when the interface between the optical waveguide structure 80B and the photodiode structure 19 is a first interface C3 and the interface between the region D of the n-type semiconductor layer 10 and the photodiode structure 19 is a second interface C4, the angle θ formed by the first interface C3 and the second interface C4 is smaller than 90°.

The p-type semiconductor layer 83 has a larger refractive index than the n-type semiconductor layer 10 and is formed of a material which can be subjected to lattice matching with the n-type semiconductor layer 10. For example, the p-type semiconductor layer 83 is made of InGaAsP. For example, a bandgap wavelength of InGaAsP of the p-type semiconductor layer 83 is equivalent to that of the optical waveguiding core layer 81. For example, a bandgap wavelength of InGaAsP of the p-type semiconductor layer 83 is 1.05 µm. For example, the p-type semiconductor layer 83 is a low-concentration p-type InGaAsP layer of which the Zn-doping concentration is $3 \times 10^{16}$ cm$^{-3}$ or lower. An impurity concentration of the p-type semiconductor layer 83 is lower than an impurity concentration of the p-type electric field control layer 12A. For example, a thickness of the p-type semiconductor layer 83 is within a range of 0.050 µm to 0.200 µm. The p-type semiconductor layer 83 ascends on the end face of the photodiode structure 19 along the first interface C3. The p-type semiconductor layer 83 comes into contact with the multiplication layer 11A, the p-type electric field control layer 12A, the optical absorption layer 13, and the p-type semiconductor layer 14 in the first interface C3.

The cladding layer 82 has a smaller refractive index than the p-type semiconductor layer 83 and the optical waveguiding core layer 81 and is formed of a material which can be subjected to lattice matching with the optical waveguiding core layer 81. For example, the cladding layer 82 is made of undoped InP. A part of the n-type semiconductor layer 10, the p-type semiconductor layer 83, the optical waveguiding core layer 81, and the cladding layer 82 constitute a stripe mesa structure extending in the optical waveguiding direction. An optical signal is confined inside the p-type semiconductor layer 83 and the optical waveguiding core layer 81 due to this stripe mesa structure and differences between refractive indices of the n-type semiconductor layer 10 and the cladding layer 82, and the p-type semiconductor layer 83 and the optical waveguiding core layer 81, and the optical signal can be propagated to the photodetector portion 6d. The side surfaces and the upper surface of this stripe mesa structure are protected by being covered by the insulating films 16 and 17 (refer to FIG. 4).

Also in the photodetector 2E of the present embodiment, similar to the first embodiment, the photodiode structure 19 includes the multiplication layer 11A and the p-type electric field control layer 12A. Accordingly, the photodiode structure 19 having an avalanche multiplication action can be obtained.

Figure 13A:
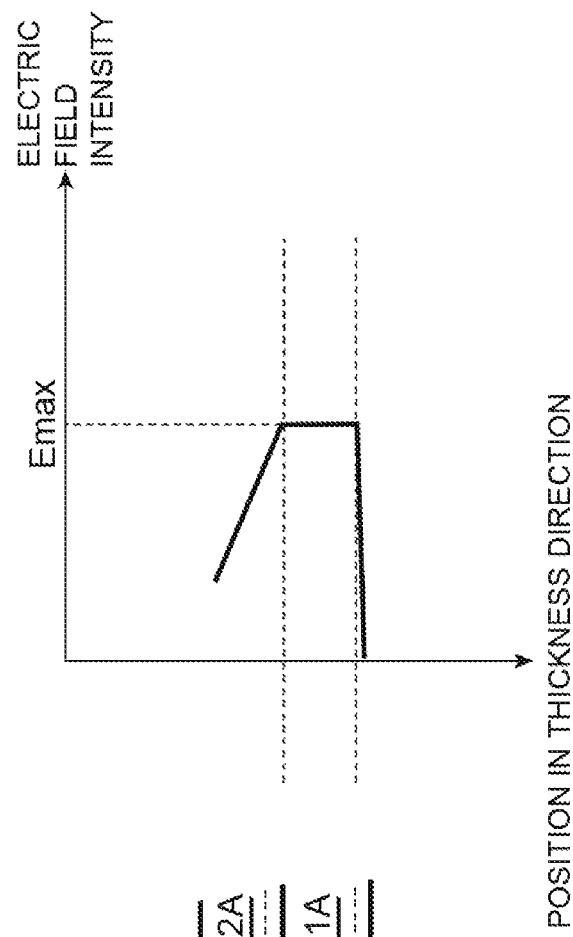
FIG. 13A is an enlarged view of a part in the vicinity of the end face of the multiplication layer in the second embodiment.

In the photodetector 2E of the present embodiment, the p-type semiconductor layer 83 having a lower impurity concentration than the p-type electric field control layer 12A is provided between the n-type semiconductor layer 10 and the optical waveguiding core layer 81. The p-type semiconductor layer 83 comes into contact with the multiplication layer 11A and the p-type electric field control layer 12A in the first interface C3. FIG. 13A is an enlarged view of a part in the vicinity of the end face 11j of the multiplication layer 11A in such a case. A region surrounded by the dotted line in the diagram shows a depleted region. When the p-type semiconductor layer 83 comes into contact with the multiplication layer 11A and the p-type electric field control layer 12A, at the time of applying a reverse bias, a part in the vicinity of the end face 11j of the multiplication layer 11A is supplemented with carriers from the p-type semiconductor layer 83. Therefore, as illustrated in FIG. 13A, the depletion range Ws of a part in the vicinity of the end face 11j of the multiplication layer 11A expands. That is, according to the photodetector 2E, the depletion range of the multiplication layer 11A can be made approximately uniform from a central part to a part in the vicinity of the end face 11j.

Figure 13B:
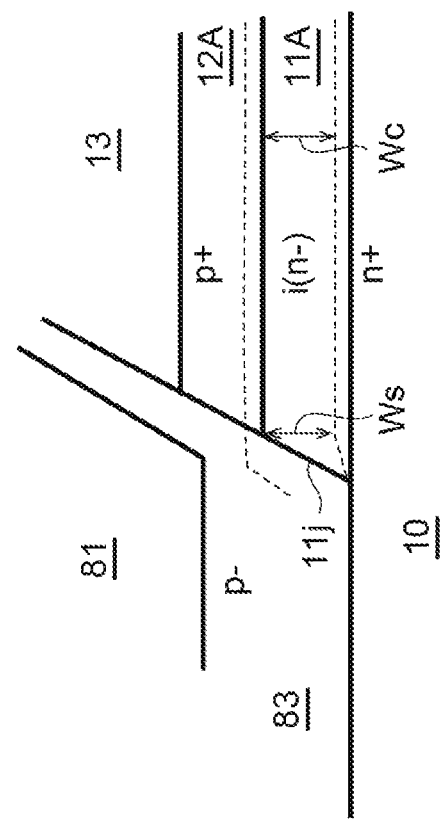
FIG. 13B is a view illustrating change in electric field intensity of the multiplication layer in the thickness direction.

FIG. 13B is a view illustrating change in electric field intensity of the multiplication layer 11A in the thickness direction. According to the present embodiment, the maximum electric field Emax of a part in the vicinity of the end face 11j of the multiplication layer 11A becomes equivalent to the maximum electric fields of other parts in the multiplication layer 11A. That is, partial increase in maximum electric field Emax in the multiplication layer 11A can be curbed. Therefore, edge breakdown can be made unlikely to occur, and deterioration in reliability due to concentration of a multiplication current can be avoided.

Hereinabove, the present disclosure has been described specifically on the basis of examples, but the present disclosure is not limited to the foregoing examples and can be changed within a range not departing from the gist thereof. For example, each of the embodiments and each of the modifications described above may be combined together as necessary in accordance with the purpose and the effect. A specific composition of each of the semiconductor layers is not limited to the foregoing examples. In the foregoing embodiment, a configuration in which the optical waveguide portions 8a, 8b, 8c, 8d, 8e, and 8f and the light receiving element portions 6a, 6b, 6c, and 6d are integrated on the common substrate 9 has been described as an example. A photoelectric conversion circuit including other InP-based electronic devices (for example, hetero junction bipolar transistors), capacitors, and resistors may be further integrated on the substrate 9. In the foregoing embodiment, the n-type semiconductor layer 10 is provided on the substrate 9. When a substrate is an n-type semiconductor substrate, the n-type semiconductor layer 10 may be omitted. In such a case, the n-type semiconductor substrate becomes the first semiconductor layer, and all the relationships between the n-type semiconductor layer 10 and other semiconductor layers in the foregoing description can be read as relationships between the n-type semiconductor substrate and other semiconductor layers.

In each of the embodiments and each of the modifications described above, a case in which the present disclosure is applied to an integrated photodetector used by a coherent wave detection method using quadrature phase shift keying (QPSK) or quadrature amplitude modulation (QAM) has been described. The present disclosure may be applied to an optical waveguide type photodetector of a method of directly detecting an intensity modulation signal such as Non-return to Zero (NRZ) or 4-level pulse amplitude modulation (PAM4).

Figure 14:
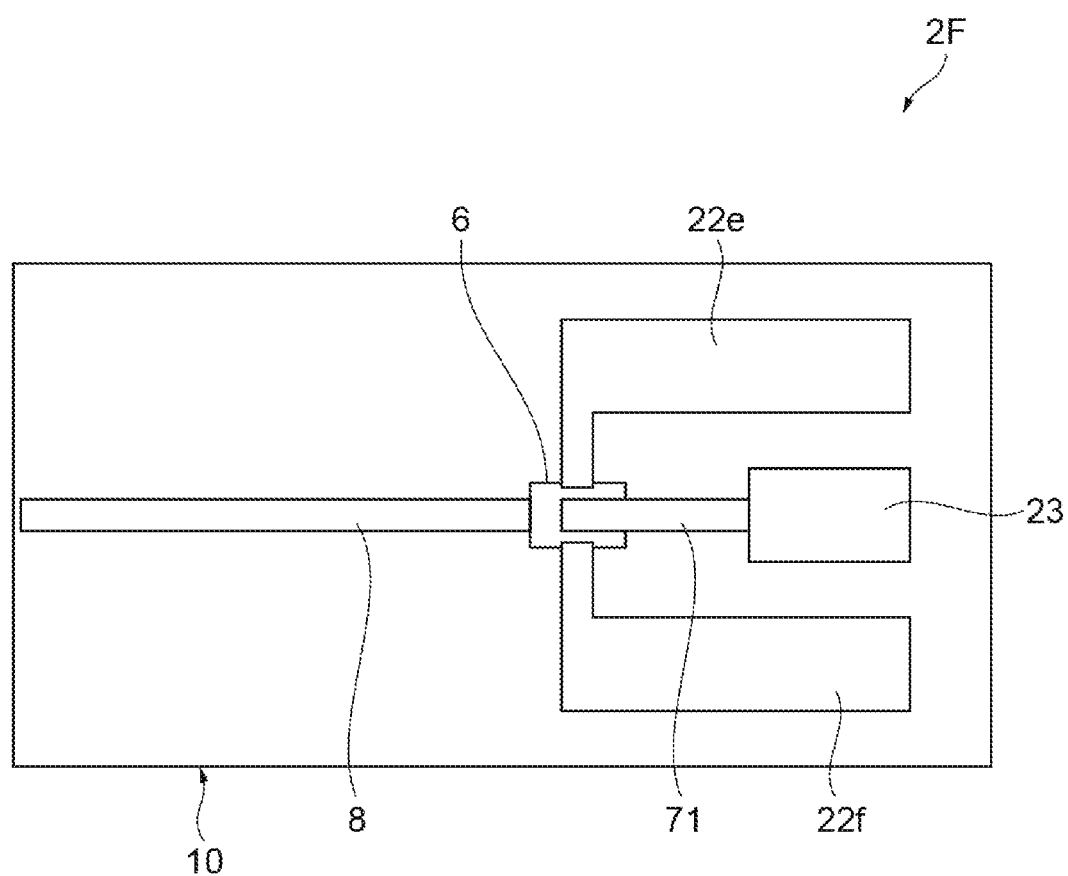
FIG. 14 is a plan view illustrating an example of the optical waveguide type photodetector.

FIG. 14 is a plan view illustrating an example of such an optical waveguide type photodetector. An optical waveguide type photodetector 2F illustrated in FIG. 14 includes the semi-insulating substrate 9 (not illustrated in FIG. 14), the n-type semiconductor layer 10, the optical waveguide portion 8, and the photodetector portion 6. The n-type semiconductor layer 10 is provided on the substrate 9. The optical waveguide portion 8 and the photodetector portion 6 are provided on the n-type semiconductor layer 10. The optical waveguide portion 8 has any of the optical waveguide structures 80 and 80B of each of the embodiments and each of the modifications described above. The photodetector portion 6 has any photodiode structure 19 of each of the embodiments and each of the modifications described above. Moreover, this photodetector 2F includes the multiplication layer 11 or 11A described above and the p-type electric field control layer 12 or 12A.

In this example, the electrode pad 23 and a wiring on the p-type ohmic electrode are electrically connected to each other via a wire 71. The bias wiring provided on the n-type ohmic electrode is electrically connected to a pair of electrode pads 22e and 22f provided on both sides of the photodetector portion 6. The configurations of this modification can also exhibit effects similar to those of the foregoing embodiment. In this example, the multiplication layer 11C of FIG. 11 may be provided in place of the multiplication layer 11 or 11A, and the p-type electric field control layer 12C of FIG. 11 may be provided in place of the p-type electric field control layer 12 or 12A. The p-type semiconductor layer 101 of FIG. 11 may be provided in place of the n-type semiconductor layer 10, and the light receiving element portion 6 may have the photodiode structure 117 of FIG. 11 in place of the photodiode structure 19.

What is claimed is:

1. An optical waveguide type photodetector comprising:
   a first semiconductor layer of a first conductive type;
   a multiplication layer being of a first conductive type and provided on the first semiconductor layer;
   an optical waveguide structure having an end face and provided on a first region of the first semiconductor layer and including an optical waveguiding core layer and a cladding layer; and
   a waveguide type photodiode structure having an end face and provided on a second region of the first semiconductor layer and having a third semiconductor layer being of a second conductive type, an optical absorption layer being of an intrinsic conductive type or of a second conductive type, and a second semiconductor layer being of a second conductive type which are arranged in this order,
   wherein the end face of the waveguide type photodiode structure and the end face of the optical waveguide structure are in contact.

2. The optical waveguide type photodetector according to claim 1, wherein
   the multiplication layer is between the first semiconductor layer and the optical waveguiding core layer and,
   the optical waveguiding core layer is provided throughout an entire area of the optical waveguide structure.

3. The optical waveguide type photodetector according to claim 1, further comprising:
   a buffer layer provided between the first semiconductor layer and the multiplication layer, the buffer layer being of a first conductive type having a lower impurity concentration than the first semiconductor layer or being an undoped layer, and
   a fourth semiconductor layer provided between the buffer layer and the multiplication layer, the fourth semiconductor layer being of a first conductive type having a higher impurity concentration than the multiplication layer.

4. The optical waveguide type photodetector according to claim 1,
   wherein the waveguide type photodiode structure further includes another semiconductor layer provided between the third semiconductor layer and the optical absorption layer.

5. The optical waveguide type photodetector according to claim 4,
   wherein the another semiconductor layer does not extend to a part of the first region of the first semiconductor layer.

6. The optical waveguide type photodetector according to claim 1,
   wherein an angle between the end face of the waveguide type photodiode structure and a plane of the third semiconductor layer is smaller than 90°.

7. The optical waveguide type photodetector according to claim 1, further comprising:
   a first ohmic electrode provided on the first semiconductor layer located outside the waveguide type photodiode structure;
   a contact layer of a second conductive type provided on the second semiconductor layer; and
   a second ohmic electrode provided on the contact layer.

8. The optical waveguide type photodetector according to claim 1, further comprising:
   a semi-insulating substrate,
   wherein the first semiconductor layer is provided on the semi-insulating substrate.

9. The optical waveguide type photodetector according to claim 1,
   wherein the first semiconductor layer and the second semiconductor layer are InP layers,
   wherein the optical absorption layer is an InGaAs layer,
   wherein the multiplication layer is an InAlAs layer, and
   wherein the third semiconductor layer is an InP layer or an InAlGaAs layer.

10. The optical waveguide type photodetector according to claim 1,
    wherein the third semiconductor layer is formed in both the first region and the second region of the first semiconductor layer.

11. An optical waveguide type photodetector comprising:
    a first semiconductor layer of a first conductive type;
    an optical waveguide structure having an end face and provided on a first region of the first semiconductor layer and including an optical waveguiding core layer and a cladding layer;
    a waveguide type photodiode structure having an end face and provided on a second region of the first semiconductor layer and having a multiplication layer being of a first conductive type, another semiconductor layer being of a second conductive type, an optical absorption layer being of an intrinsic conductive type or a second conductive type, and a second semiconductor layer being of a second conductive type which are arranged in this order, the end face of the waveguide type photodiode structure facing the end face of the optical waveguide structure; and
    still another semiconductor layer of a second conductive type located between the end face of the optical waveguide structure and the end face of the waveguide type photodiode structure and in contact with the multiplication layer at the end face of the waveguide type photodiode structure.

12. The optical waveguide type photodetector according to claim 11,
    wherein the multiplication layer and the another semiconductor layer do not extend to between the first region of the first semiconductor layer and the optical waveguiding core layer.

13. The optical waveguide type photodetector according to claim 11, wherein a bandgap of the still another semiconductor layer is equivalent to a bandgap of the optical waveguiding core layer.

14. The optical waveguide type photodetector according to claim 11,
wherein a thickness of the still another semiconductor layer is within a range of 0.050 μm to 0.200 μm.

15. The optical waveguide type photodetector according to claim 11,
wherein an impurity concentration of the still another semiconductor layer is lower than an impurity concentration of the another semiconductor layer.

16. The optical waveguide type photodetector according to claim 11,
wherein the first semiconductor layer and the second semiconductor layer are InP layers,
wherein the optical absorption layer is an InGaAs layer,
wherein the multiplication layer is an InAlAs layer,
wherein the sixth semiconductor layer is an InGaAsP a layer, and
wherein the seventh semiconductor layer is an InP layer or an InAlGaAs layer.

* * * * *